(12) United States Patent
Shirota et al.

(10) Patent No.: US 12,738,547 B2
(45) Date of Patent: Sep. 15, 2026

(54) BATTERY MONITORING MODULE AND FLEXIBLE PRINTED WIRING BOARD

(71) Applicant: MEKTEC CORPORATION, Tokyo (JP)

(72) Inventors: Katsuhito Shirota, Tokyo (JP); Tomoki Kanayama, Tokyo (JP); Shuzo Yamada, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 618 days.

(21) Appl. No.: 18/186,868

(22) Filed: Mar. 20, 2023

(65) Prior Publication Data

US 2023/0395878 A1 Dec. 7, 2023

(30) Foreign Application Priority Data

Jun. 2, 2022 (JP) ................................ 2022-090187

(51) Int. Cl.

| | |
|---|---|
| ***H01M 10/42*** | (2006.01) |
| ***H05K 1/02*** | (2006.01) |
| ***H05K 1/03*** | (2006.01) |

(52) U.S. Cl.

CPC ........ *H01M 10/425* (2013.01); *H05K 1/0281* (2013.01); *H05K 1/0393* (2013.01)

(58) Field of Classification Search

CPC .. H01M 10/425; H01M 10/48; H01M 50/569; H05K 1/0281; H05K 1/0393; H05K 2201/052; H05K 2201/055; H05K 2201/10037; H05K 2201/2009; H05K 1/189; H05K 1/028; Y02E 60/10

See application file for complete search history.

(56) References Cited

U.S. PATENT DOCUMENTS

| | | | | |
|---|---|---|---|---|
| 2011/0024205 | A1* | 2/2011 | Nishihara | H01M 10/48 429/90 |
| 2012/0328920 | A1* | 12/2012 | Takase | H01M 50/503 429/158 |
| 2014/0131071 | A1* | 5/2014 | Tanaka | H05K 1/028 174/254 |
| 2018/0286316 | A1* | 10/2018 | Yuki | G02F 1/13454 |
| 2018/0358820 | A1* | 12/2018 | Mizoguchi | H02J 7/52 |
| 2019/0198944 | A1* | 6/2019 | Tanabe | H01M 50/581 |
| 2020/0006814 | A1* | 1/2020 | Oota | H01M 10/482 |
| 2020/0020912 | A1* | 1/2020 | Ota | H01M 10/425 |

FOREIGN PATENT DOCUMENTS

| | | |
|---|---|---|
| JP | 6774460 B2 | 10/2020 |

* cited by examiner

*Primary Examiner* — Thienvu V Tran
*Assistant Examiner* — Muaamar Qahtan Al-Taweel
(74) *Attorney, Agent, or Firm* — Studebaker Brackett PLLC

(57) ABSTRACT

Provided is a flexible printed wiring board attached to a battery, including: multiple lines are provided only on one surface of the flexible printed wiring board, one end of a first line group and a second line group are respectively connected to one of multiple terminals of the battery, and the other end of the first line group is arranged in a bent portion, and the other end of the second line group and one end of a third line group are arranged at an end portion of a trunk portion, and the other end of the third line group is arranged in the trunk portion, and the bent portion is bent such that the other end of the first line group arranged in the bent portion and the other end of the third line group arranged in the trunk portion are connected to each other.

15 Claims, 12 Drawing Sheets

PAB1

PAB3

PAB5

B

B

103

102

120A 0 2 4 6 8 10

PAB7

PAB9

140A 9 7 5 3 1

130A 0 1 2 3 4
100B
102c
110B
102c
PAB3
140B
PAB1
0
102a
102b
115B
1
102a
2
102b
102a
103
3
4

BATTERY MONITORING MODULE AND FLEXIBLE PRINTED WIRING BOARD

CROSS-REFERENCE TO RELATED APPLICATION

This application claims priority from Japanese Patent Application No. 2022-090187 filed with the Japan Patent Office on Jun. 2, 2022, the entire content of which is hereby incorporated by reference.

BACKGROUND

1. Technical Field

The present disclosure relates to a battery monitoring module and a flexible printed wiring board.

2. Related Art

For example, a voltage monitoring device that monitors the voltage of a battery mounted on an electric vehicle is provided for the battery. As this voltage monitoring device, a battery monitoring module having a flexible printed wiring board (hereinafter, referred to as an FPC) has been known. A battery monitoring module according to the prior art will be described with reference to FIGS. 11 and 12. FIG. 11 is a view for describing electric wiring of the battery monitoring module attached to a battery. FIG. 12 is a plan view showing a state in which the battery monitoring module according to the prior art is attached to the battery.

The battery includes multiple cell units 10. These multiple cell units 10 are arrayed such that positive and negative electrodes of adjacent ones of the cell units 10 face each other. These multiple cell units 10 are connected in series in such a manner that the positive and negative electrodes of adjacent ones of the cell units 10 are electrically connected to each other via a bus bar 11 functioning as a terminal. Note that the cell unit 10 includes a single cell or multiple cells connected in parallel.

In FIGS. 11 and 12, the multiple cell units 10 are provided in parallel in the direction from the top to the bottom in the figure. It is assumed that the potential of the bus bar 11 is, in an ascending order of potential, V(0), V(1), V(2), V(3), . . . , V(2n−3), V(2n−2), V(2n−1), and V(2n). Note that in FIGS. 11 and 12, the potential of the bus bar 11 is represented only by the number in the parentheses without V( ). As shown in the figure, the potentials of the multiple bus bars 11 increase in an array direction of the cell units 10 in an alternate manner on both sides with respect to the direction (the right-left direction in the figure) perpendicular to the array direction.

A battery monitoring module 600 is attached to an upper portion of the battery configured as described above (see FIG. 12). The battery monitoring module 600 includes an FPC 610 and a connector 620 connected to an edge portion of the FPC 610. Generally, as a potential difference between adjacent ones of lines of an FPC and a potential difference between adjacent ones of terminals of a connector connected to the FPC increase, short-circuit due to, e.g., migration are more likely to occur. Specifically, if a distance between adjacent ones of the lines or a distance between adjacent ones of the terminals is short, such a problem becomes drastic. A smaller potential difference between the lines is also preferable for an ECU circuit connected to the FPC, and on an FPC side, the lines are arranged in the order of potential (the order of potential level) to the extent possible so that an effort of rearranging lines on the ECU circuit can be minimized and an ECU circuit board can be simplified. As described above, there is a demand for a decrease in, to the extent possible, the potential difference between adjacent ones of the lines and the potential difference between adjacent ones of the terminals. For this reason, the potentials of the multiple lines connected to the connector 620 are preferably arranged in the order of V(0), V(1), V(2), V(3), . . . , V(2n−3), V(2n−2), V(2n−1), and V(2n) (see FIG. 11).

However, in the case of an FPC (single-sided FPC) including a conductor (e.g., copper foil) only on one side of a base film, the above-described configuration in which the lines are arranged in the order of potential cannot be obtained only by a change in a line printing pattern. This is because as shown in FIG. 11, the lines need to be rearranged so as to cross each other in order to arrange the lines in the order of potential. Thus, the battery monitoring module according to the prior art employs, as shown in FIG. 12, the FPC 610 (double-sided FPC) including conductors on both surfaces of the base film. In FIG. 12, the line provided on one surface of the base film is indicated by a solid line, and the line provided on the other surface is indicated by a dashed line. The double-sided FPC is employed as described above so that the potentials of the multiple lines connected to the connector 620 can be arranged in the order of V(0), V(1), V(2), V(3), . . . , V(2n−3), V(2n−2), V(2n−1), and V(2n).

However, in the case of the double-sided FPC, the degree of difficulty in manufacturing increases as the size of the FPC increases, leading to a problem that a cost increases.

Note that a technique has been known, in which a single-sided FPC is used and an end portion of each line is arranged at the center of the FPC such that the potentials of the end portions of these lines are arranged in the above-described order of potential (see Japanese Patent No. 6774460).

However, in the case of Japanese Patent No. 6774460, the end portion of each line is arranged at the center of the FPC, and for this reason, a general connector to be connected to an edge portion of an FPC cannot be employed.

As described above, in the technique of Japanese Patent No. 6774460, applicable connectors are limited, and there is still room for improvement.

SUMMARY

A flexible printed wiring board according to the present disclosure, which is attached to a battery, is configured to include: a trunk portion; a first branch portion; a second branch portion; a bent portion; and multiple lines. The flexible printed wiring board is also configured such that: the multiple lines are provided only on one surface of the flexible printed wiring board, and include a first line group, a second line group, and a third line group; the first line group is arranged over the trunk portion, the first branch portion, and the bent portion; the second line group is arranged over the trunk portion and the second branch portion; the third line group is arranged at the trunk portion; one end of each line of the first line group is connected to a corresponding one of multiple terminals of the battery and the other end of each line of the first line group is arranged in the bent portion; one end of each line of the second line group is connected to a corresponding one of the multiple terminals of the battery, and the other end of each line of the second line group is arranged at an end portion of the trunk portion in a longitudinal direction of the flexible printed wiring board; one end of each line of the third line group is arranged at the end portion of the trunk portion, and the other end of each line of the third line group is arranged in the trunk portion; and the bent portion is bent such that the other end of each line of the first line group arranged in the bent portion and the other end of each line of the third line group arranged in the trunk portion are connected to each other.

BRIEF DESCRIPTION OF THE DRAWINGS

FIGS. 4A and 4B are schematic sectional views of the flexible printed wiring board according to the first embodiment of the present disclosure;

DETAILED DESCRIPTION

Figure 1:
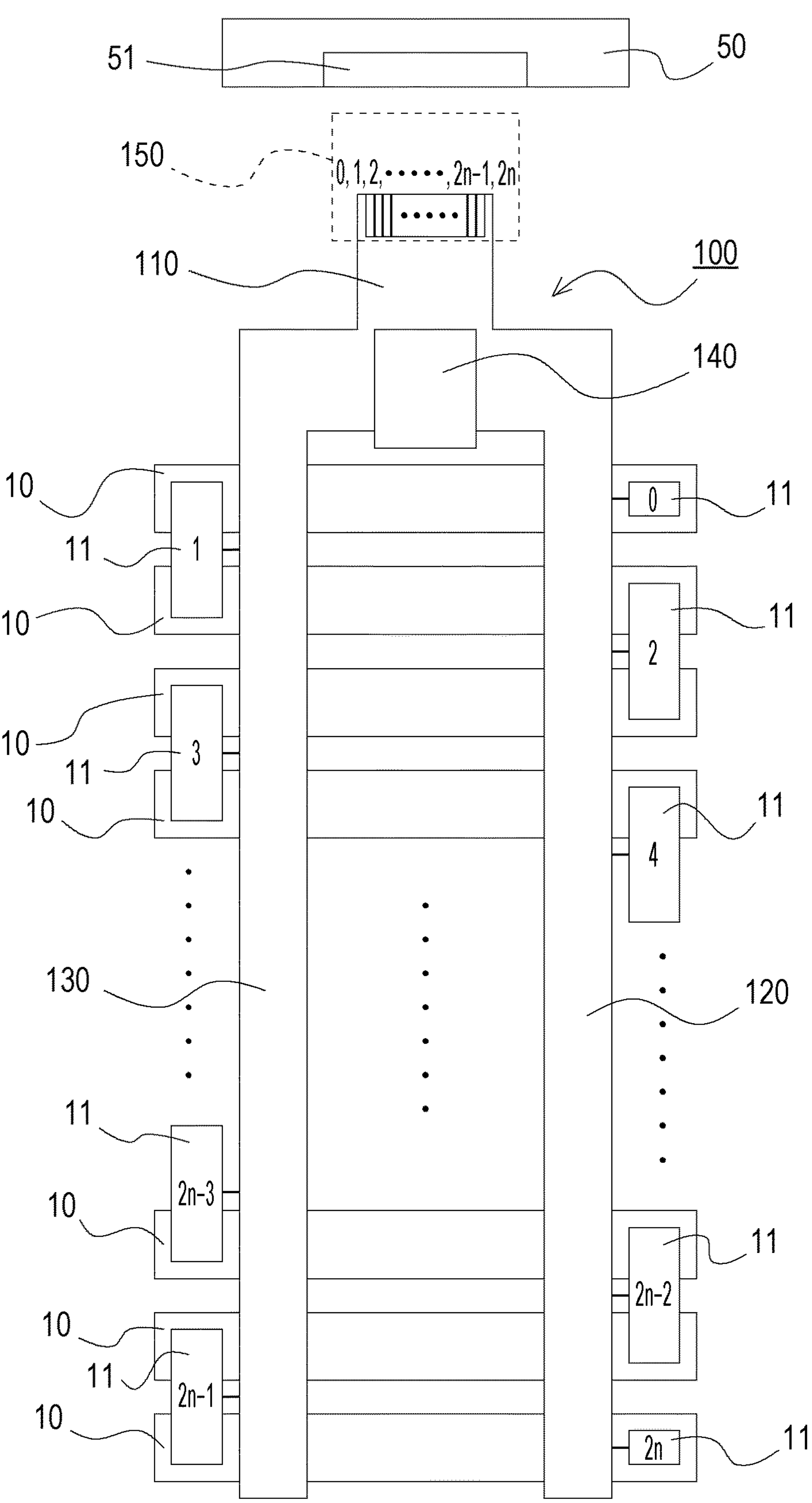
FIG. 1 is a plan view showing a state in which a battery monitoring module according to a first embodiment of the present disclosure is attached to a battery.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One object of the present disclosure is to provide a battery monitoring module configured so that arrangement of lines can be changed while a cost is reduced.

The present disclosure employs the following technique in order to solve the above-described problem.

A flexible printed wiring board according to an aspect of the present disclosure is attached to a battery, the flexible printed wiring board including: a trunk portion; a first branch portion; a second branch portion; a bent portion; and multiple lines, in which the multiple lines are provided only on one surface of the flexible printed wiring board, and include a first line group, a second line group, and a third line group, the first line group is arranged over the trunk portion, the first branch portion, and the bent portion, the second line group is arranged over the trunk portion and the second branch portion, the third line group is arranged at the trunk portion, one end of each line of the first line group is connected to a corresponding one of multiple terminals of the battery, and the other end of each line of the first line group is arranged in the bent portion, one end of each line of the second line group is connected to a corresponding one of the multiple terminals of the battery, and the other end of each line of the second line group is arranged at an end portion of the trunk portion in a longitudinal direction of the flexible printed wiring board, one end of each line of the third line group is arranged at the end portion of the trunk portion, and the other end of each line of the third line group is arranged in the trunk portion, and the bent portion is bent such that the other end of each line of the first line group arranged in the bent portion and the other end of each line of the third line group arranged in the trunk portion are connected to each other.

The flexible printed wiring board according to an aspect of the present disclosure is configured such that, in a case where potentials of the multiple terminals increase in an order of $V(0)$, $V(1)$, $V(2)$, $V(3)$, . . . , $V(2n-3)$, $V(2n-2)$, $V(2n-1)$, and $V(2n)$ (n is an integer), the one end of each line of the first line group is connected to a corresponding one of the multiple terminals of which potentials are $V(0)$, $V(2)$, . . . , $V(2n-2)$, and $V(2n)$, the one end of each line of the second line group is connected to a corresponding one of the multiple terminals of which potentials are $V(1)$, $V(3)$, . . . , $V(2n-3)$, and $V(2n-1)$, and potentials of the multiple lines arranged at the end portion of the trunk portion are arranged in an order of $V(0)$, $V(1)$, $V(2)$, $V(3)$, . . . , $V(2n-3)$, $V(2n-2)$, $V(2n-1)$, and $V(2n)$.

Further, a battery monitoring module according to an aspect of the present disclosure comprises: the flexible printed wiring board; and a connector. The connector is attached to the end portion of the trunk portion of the flexible printed wiring board.

According to this disclosure, line arrangement (arrangement order) can be changed and a potential difference between adjacent ones of the lines can be decreased, using the flexible printed wiring board including the multiple lines only on one surface of a base film. Here, "one end of the line" includes not only one tip end of the line, but also the vicinity of one tip end. Moreover, the "other end of the line" includes not only the other tip end of the line, but also the vicinity of the other tip end. Note that the present disclosure also includes a case where the multiple lines provided on the flexible printed wiring board include lines used for purposes other than the purpose for electric connection to electrodes of the battery. In this case, the lines used for the purposes other than the purpose for electric connection to the electrodes of the battery may be provided among the multiple lines connected to the electrodes of the battery. A relationship between the potential of each line used for the purpose other than the purpose for connection to the electrode of the battery and the potential of each line connected to the electrode of the battery is not specifically limited.

The bent portion (expected bending region) may be provided only at one location at the flexible printed wiring board. The bent portions (expected bending regions) may be provided, at multiple locations at the flexible printed wiring board, corresponding to the lines arranged at the multiple first branch portions or the multiple second branch portions provided in the flexible printed wiring board.

The bent portion (expected bending region) may be bent once at one bending line, or may be bent twice at two bending lines.

As described above, according to the present disclosure, line arrangement can be changed while the cost can be reduced.

Hereinafter, exemplary modes for carrying out the present disclosure will be described in detail based on embodiments with reference to the drawings. Note that unless otherwise specified, the dimensions, materials, shapes, relatively arrangement and the like of components described in the embodiments do not limit the scope of the present disclosure.

First Embodiment

A battery monitoring module according to a first embodiment of the present disclosure will be described with reference to FIGS. 1 to 4B. The battery monitoring module according to the present embodiment is suitably provided, for example, in a voltage monitoring device that monitors the voltage of a battery mounted on an electric vehicle.

<Configuration of Battery Monitoring Module>

FIG. 1 is a plan view showing a state in which the battery monitoring module according to the first embodiment of the present disclosure is attached to the battery. The battery includes multiple cell units 10. These multiple cell units 10 are arrayed such that positive and negative electrodes of adjacent ones of the cell units 10 face each other. These multiple cell units 10 are connected in series in such a manner that the positive and negative electrodes of adjacent ones of the cell units 10 are electrically connected to each other via a bus bar 11 functioning as a terminal. In FIG. 1, each cell unit 10 is shown as an elongated rectangular shape. Thus, the right-left direction in the figure may be referred to as a length direction of the cell unit 10, and the up-down direction in the figure may be referred to as a width direction of the cell unit 10. In FIG. 1, the multiple cell units 10 are provided in parallel in the width direction of the cell unit 10.

Figure 2A:
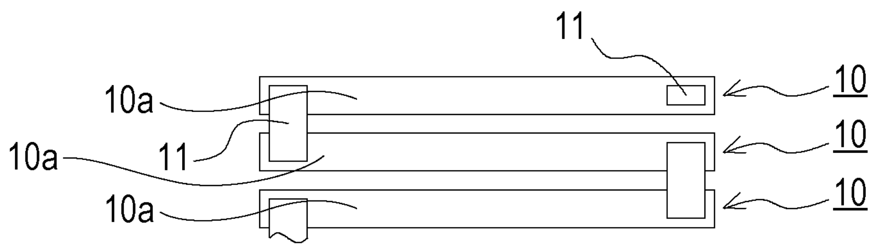
FIGS. 2A to 2C are views for describing a cell unit.
Figure 2B:
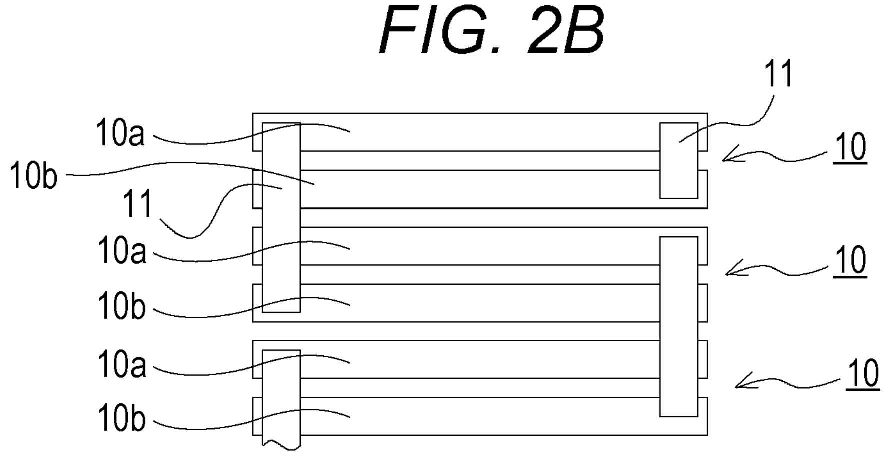
Figure 2C:
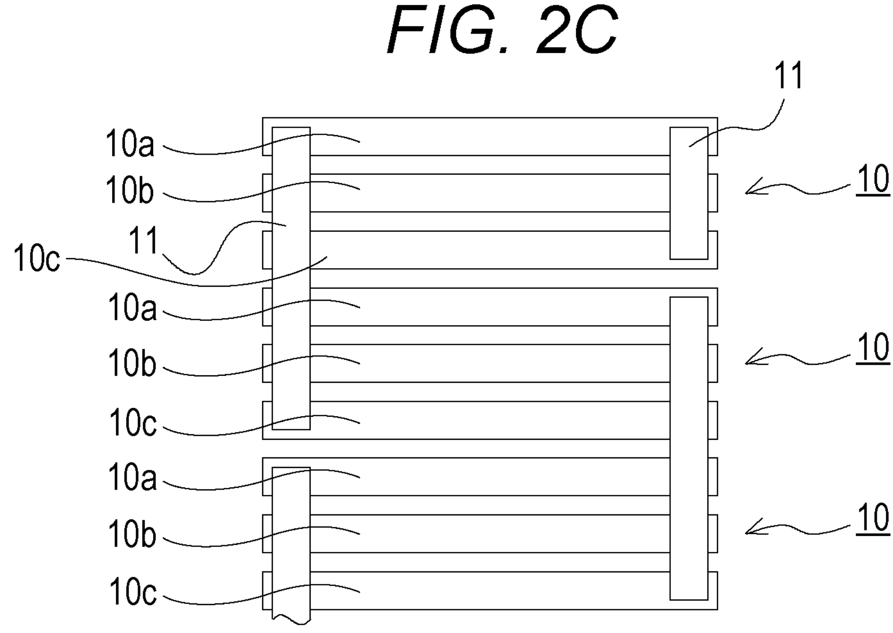

The cell unit 10 will be described with reference to FIGS. 2A to 2C. FIGS. 2A to 2C are plan views showing some examples of the cell unit 10 of the present disclosure. The cell unit 10 includes a single cell or multiple cells connected in parallel FIG. 2A shows a case where the cell unit 10 includes a single cell 10*a* In this case, positive and negative electrodes of adjacent ones of the cells 10*a* are connected to each other via the bus bar 11 which is the terminal. Note that in one, which is at an endmost location, of the multiple arrayed cell units 10 (in this case, the cells 10*a*), the bus bar 11 not connected to the adjacent cell unit 10 is provided on one of the positive or negative electrode, and the bus bar 11 connected to the adjacent cell unit 10 is provided on the other one of the positive or negative electrode.

FIG. 2B shows a case where the cell unit 10 includes two cells 10*a*. 10*b*. In this case, the two cells 10*a*, 10*b* are connected in parallel via the bus bar 11, thereby forming the cell unit 10. The positive and negative electrodes of the cell units 10, each of which includes the two cells 10*a*, 10*b*, are connected to each other via the bus bar 11 which is the terminal. Note that in one, which is at an endmost location, of the multiple arrayed cell units 10, the bus bar 11 not connected to the adjacent cell unit 10 is provided on one of the positive or negative electrode, and the bus bar 11 connected to the adjacent cell unit 10 is provided on the other one of the positive or negative electrode.

FIG. 2C shows a case where the cell unit 10 includes three cells 10*a*, 10*b*, 10*c*. In this case, the three cells 10*a*, 10*b*, 10*c* are connected in parallel via the bus bar 11, thereby forming the cell unit 10. The positive and negative electrodes of the cell units 10, each of which includes the three cells 10*a*, 10*b*, 10*c*, are connected to each other via the bus bar 11 which is the terminal. Note that in one, which is at an endmost location, of the multiple arrayed cell units 10, the bus bar 11 not connected to the adjacent cell unit 10 is provided on one of the positive or negative electrode, and the bus bar 11 connected to the adjacent cell unit 10 is provided on the other one of the positive or negative electrode. Also, in a case where the cell unit 10 includes four or more cells, these cell units 10 are electrically connected in a similar manner.

It is assumed that the potential of each bus bar 11 (terminal) connected at least to either one of the positive or negative electrode of the cell unit 10 is, in an ascending order of potential, V(0), V(1), V(2), V(3), . . . , V(2n−3), V(2n−2), V(2n−1), and V(2n). Note that in a case where the potential is represented as described above, n is an integer, but the number of bus bars 11 and the number of potentials are not limited to above. In each figure, the potential of the bus bar 11 is represented only by the number in the parentheses without V( ).

As shown in FIG. 1, the multiple bus bars 11 are alternately provided on one end side and the other end side of the multiple cell units 10 in the length direction of the cell unit 10. The potentials of the multiple bus bars 11 increase in an array direction (in FIG. 1, the direction from the top to the bottom) of the cell units 10 in an alternate manner on both sides with respect to the direction (the length direction of the cell unit 10, the right-left direction in FIG. 1) perpendicular to the array direction of the cell units 10.

The battery monitoring module is attached to an upper portion of the battery configured as described above. The battery monitoring module includes a flexible printed wiring board (hereinafter sometimes referred to as an "FPC 100") and a connector 150. In the battery monitoring module, the connector 150 is attached to an edge portion of the FPC 100 on one side in the array direction of the cell units 10. In FIG. 1, only the outer shape of the connector 150 is indicated by a dashed line. In the battery monitoring module of the present embodiment, the connector 150 is attached to an edge portion of a tip end of the FPC 100 closest to one side in the array direction of the cell units 10. Note that the connector 150 may only be required to have a configuration attachable to the edge portion of the FPC by various well-known techniques, and therefore, detailed description of the connector 150 will be omitted.

In a case where the battery monitoring module is used for the voltage monitoring device mounted on the electric vehicle, the connector 150 is connected to a connector 51 provided in an ECU 50. Note that in FIG. 1, only the configuration of a main portion of the battery monitoring module is shown. Generally, the battery monitoring module also includes a case to which the FPC is fixed, a temperature sensor that measures the temperature of the battery (cell), and the like, but these components are not shown in FIG. 1.

<FPC>

Figure 3A:
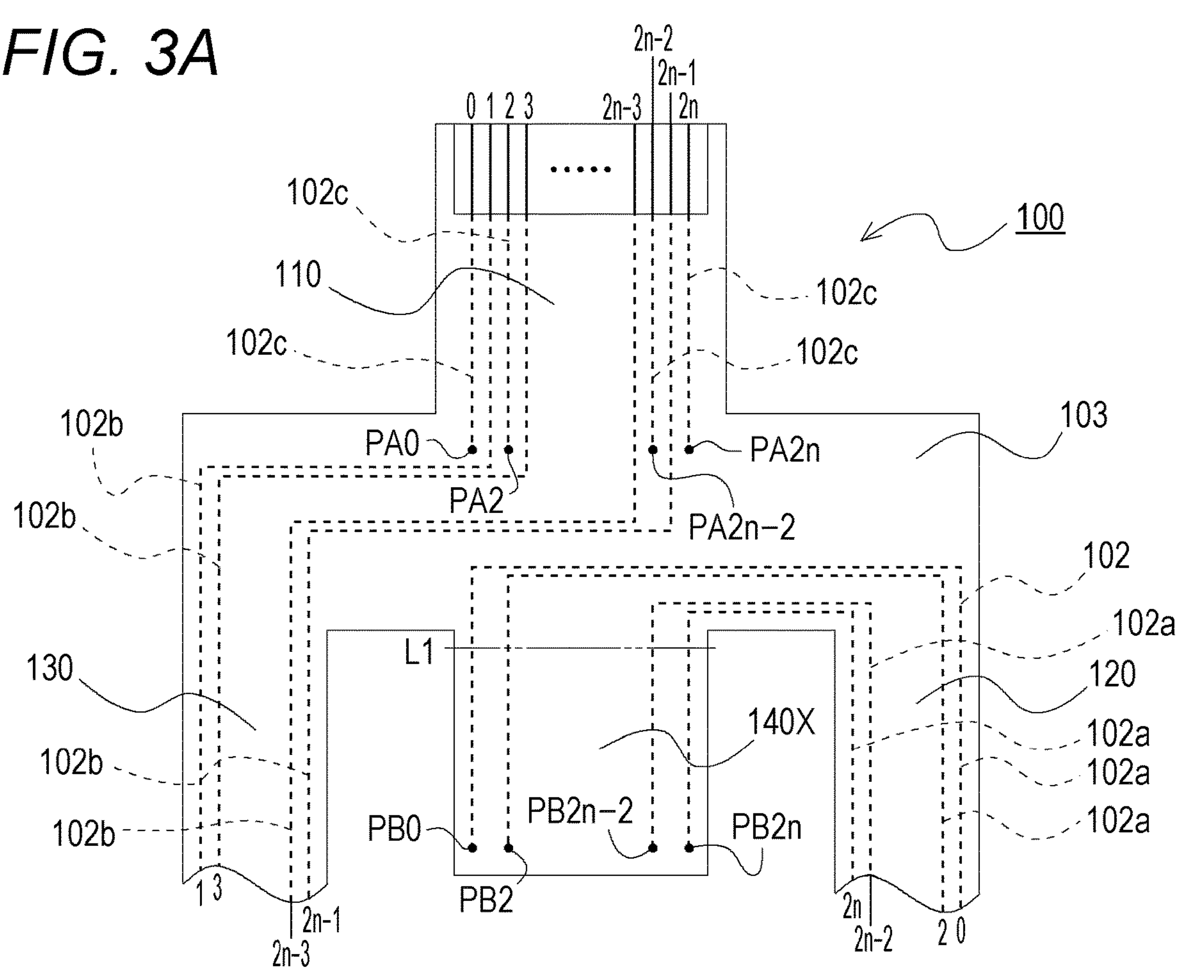
FIGS. 3A and 3B are enlarged views of a main portion of a flexible printed wiring board according to the first embodiment of the present disclosure.
Figure 3B:
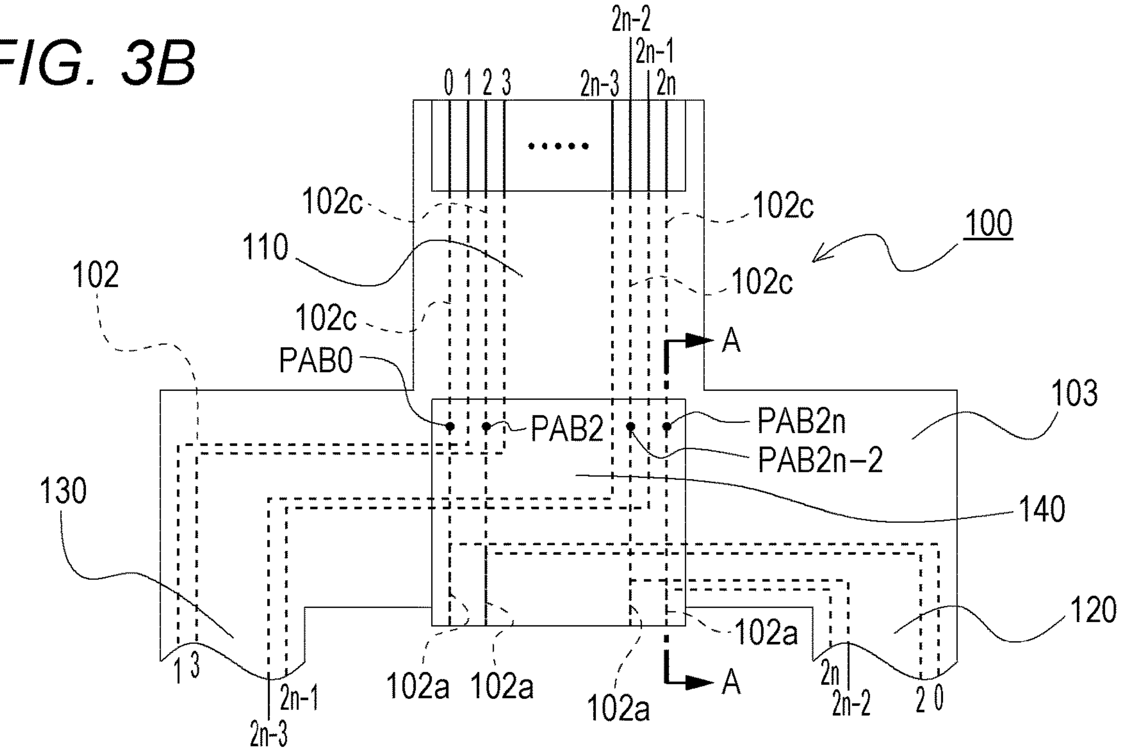

The FPC 100 will be described in more detail specifically with reference to FIGS. 3A and 3B. The FPC 100 is a single-sided FPC having a conductor (e.g., copper foil) forming multiple lines only on one surface of a base film of the FPC 100. FIGS. 3A and 3B are enlarged views (views showing part of a plan view in closeup) of a main portion of the FPC according to the first embodiment of the present disclosure. In the figure, the lines provided inside are indicated by dashed lines.

The FPC 100 according to the present embodiment includes a trunk portion 110, a first branch portion 120 and a second branch portion 130 branched from the trunk portion 110, and a bent portion 140. In each portion, multiple lines

102 formed by etching of metal foil (e.g., copper foil) are provided. The multiple lines 102 are exposed at an end portion of the trunk portion 110. The connector 150 is provided at the end portion of the trunk portion 110, and multiple terminals (not shown) included in the connector 150 and the multiple exposed lines 102 are electrically connected to each other.

That is, the edge portion (the portion provided with the connector 150) of the FPC on one side in the array direction of the cell unit 10 may also be referred to as an end portion of the trunk portion 110 in a longitudinal direction of the FPC. In the present embodiment, the end portion of the trunk portion 110 in the longitudinal direction of the FPC 100 is located on the upper side in FIGS. 3A and 3B, and the bent portion 140 extends from the trunk portion 110 to the side (the lower side in the figure) opposite to the end portion of the trunk portion 110.

In the present embodiment, the first branch portion 120 is arranged in the vicinity of the bus bars 11 of which potentials are V(0), V(2), . . . , V(2n−2), and V(2n). Moreover, the second branch portion 130 is arranged in the vicinity of the bus bars 11 of which potentials are V(1), V(3), . . . , V(2n−3), and V(2n−1) (see FIGS. 1 and 3).

In FIGS. 3A and 3B, only the lines 102 connected to the bus bars 11 of which potentials are V(0) to V(3) and V(2n−3) to V(2n) are shown, and the lines 102 connected to the bus bars 11 of which potentials are V(4) to V(2n−4) are not shown.

The multiple lines 102 include a first line group, a second line group, and a third line group. One end of the first line group, i.e., one end of each line of the first line group, is connected to a corresponding one of the bus bars 11 of which potentials are V(0), V(2), . . . , V(2n−2), and V(2n). Each line forming the first line group is shown as a line 102*a* in the figure. One end of the second line group, i.e., one end of each line of the second line group, is connected to a corresponding one of the bus bars 11 of which potentials are V(1), V(3), . . . , V(2n−3), and V(2n−1), Each line forming the second line group is shown as a line 102*b* in the figure. One end of the third line group, i.e., one end of each line of the third line group, is arranged at the edge portion (the portion provided with the connector 150) of the FPC 100 on one side in the array direction of the cell units 10. Note that the “edge portion of the FPC 100 on one side in the array direction of the cell units 10” is equivalent to one end portion of the FPC 100 in the longitudinal direction thereof in the case of the present embodiment. Each line forming the third line group is shown as a line 102*c* in the figure.

In the present embodiment, the line 102*a* of the first line group is arranged over the first branch portion 120, the trunk portion 110, and the bent portion 140, the line 102*b* of the second line group is arranged over the second branch portion 130 and the trunk portion 110, and the line 102*c* of the third line group is arranged at the trunk portion 110.

Note that the line and the bus bar 11 may be directly electrically connected using, e.g., solder or may be indirectly electrically connected via other members (e.g., a conductor provided in the not-shown case), needless to say. The same also applies to each embodiment below.

The other end of each line 102*b* of the second line group is arranged at the edge portion (the end portion of the trunk portion 110 of the FPC 100) of the FPC 100 on one side in the array direction of the cell units 10. The other end of each line 102*a* of the first line group is arranged in an expected bending region 140X of the FPC 100. FIG. 3A is the view showing part of the plan view in closeup in a state before the FPC 100 is bent. Moreover, FIG. 3B is the view showing part of the plan view in closeup in a state after the FPC 100 has been bent and end portions of the lines 102 have been electrically connected to each other. The expected bending region 140X is bent at a bending line L1 indicated by a chain double-dashed line in FIG. 3A, and in this manner, the above-described bent portion 140 is formed. Thus, in FIG. 3A, a region to be the bent portion 140 after bending is equivalent to the above-described “expected bending region 140X.”

As shown in FIG. 3A, the other end of each line 102*a* of the first line group is indicated by points PB0, PB2, . . . , PB2*n*−2, PB2*n* (in this case, n is an integer). Moreover, the other end of each line 102*c* of the third line group is indicated by points PA0, PA2, . . . , PA2*n*−2, PA2*n* (in this case, n is an integer).

In the FPC 100 according to the present embodiment, the expected bending region 140X is bent, and accordingly, the other end of each line 102*a* of the first line group and the other end of each line 102*c* of the third line group are electrically connected to each other. As shown in FIG. 3B, electric connection portions where these lines are electrically connected to each other are indicated by points PAB0, PAB2, . . . , PAB2*n*−2, PAB2*n*. With the above-described configuration, the potentials of the multiple lines arranged at the edge portion (the portion provided with the connector 150) of the FPC 100 on one side in the array direction of the cell units 10 can be arranged in the order of V(0), V(1), V(2), V(3), . . . , V(2n−3), V(2n−2), V(2n−1), and V(2n) (in this case, n is an integer). That is, the potentials of the multiple lines arranged at the portion of the FPC 100 provided with the connector 150 can be arranged in the order according to the level of the potential of the bus bar 11.

<Electric Connection Portion>

Figures 4A, 4B:
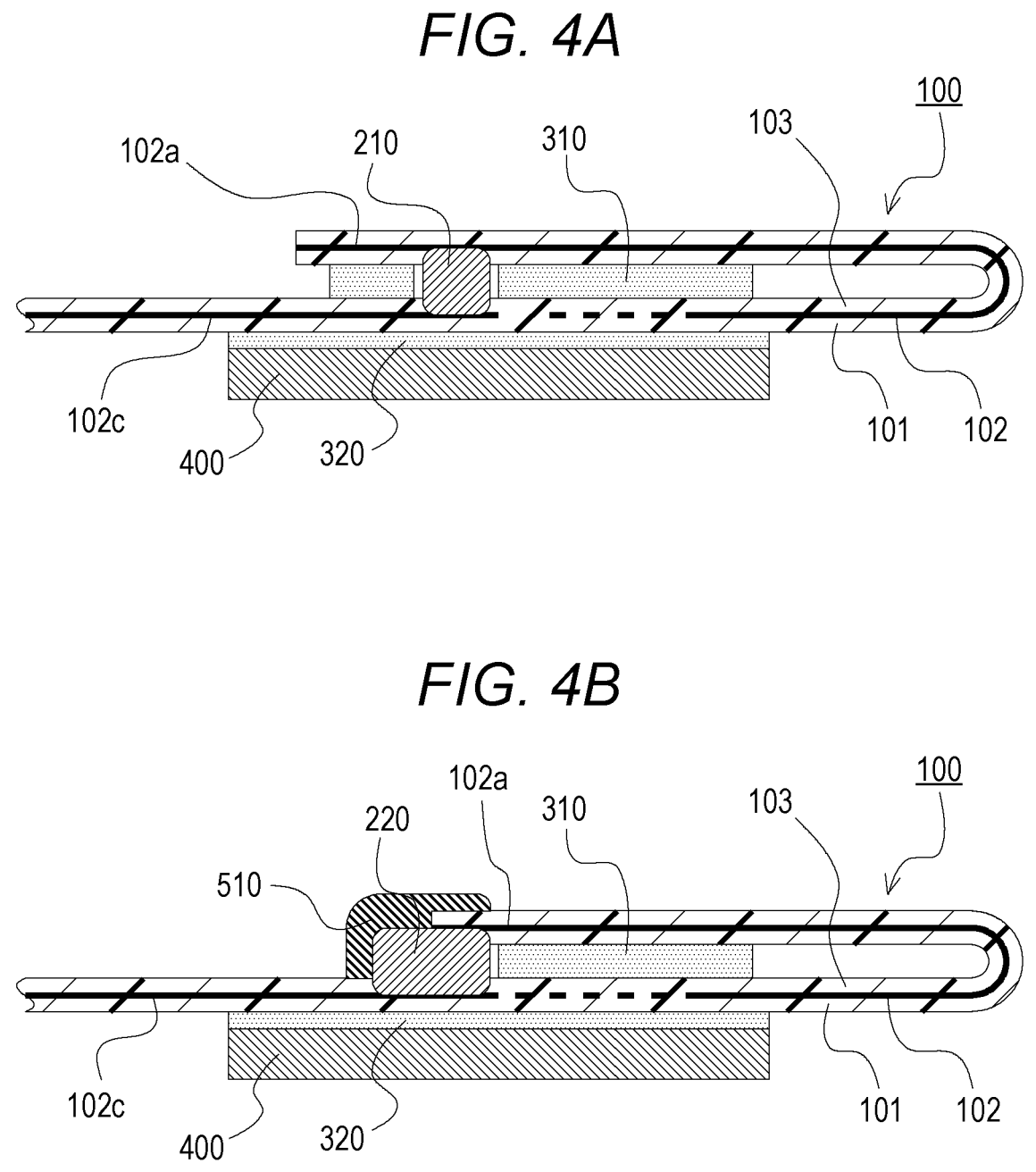

The configuration of the electric connection portion where the other end of each line 102*a* of the first line group and the other end of each line 102*c* of the third line group are electrically connected to each other will be described. As a technique of forming the electric connection portion, various well-known techniques can be employed. Hereinafter, the configurations of two types of electric connection portion will be described with reference to FIGS. 4A and 4B. Note that schematic sectional views shown in FIGS. 4A and 4B are equivalent to sectional views along an AA line of FIG. 3B.

First, the configuration of the electric connection portion shown in FIG. 4A will be described. The FPC 100 includes the base film 101, the multiple lines 102 provided on one surface of the base film 101, and a cover film 103 covering the multiple lines 102. The multiple lines 102 are formed by etching of metal foil (e.g., copper foil). After the multiple lines 102 have been formed, the cover film 103 is joined onto the base film 101 and the multiple lines 102. Although not shown in the figure, an adhesive layer is provided between the cover film 103 and the base film 101, for example.

The cover film 103 in the vicinity of the other end of each line 102*a* of the first line group and the cover film 103 in the vicinity of the other end of each line 102*c* of the third line group are provided with openings. Thus, the other end (more specifically, the vicinity of the tip end on the other side) of each line 102*a* of the first line group and the other end (more specifically, the vicinity of the tip end on the other side) of each line 102*c* of the third line group are exposed. In a state in which the expected bending region 140X is bent, the exposed portion of the line 102*a* and the exposed portion of the line 102*c* are electrically connected to each other via a solder portion 210.

In the above-described electric connection portion, the solder portion 210 may be formed, for example, in such a manner that solder plating is applied and heated by hot press. Needless to say, the solder portion 210 may be provided by other methods (laser soldering, reflow).

Note that in order to visually recognize the electric connection portion, a through-hole may be provided at the portion of the FPC 100 provided with the solder portion 210. In order to prevent the bent portion 140 from returning due to springback and further enhance insulating properties, a configuration is preferably employed, in which the layers of the cover film 103 are bonded (adhere) to each other via, e.g., an adhesive (adhesive compound) 310 in the vicinity of the solder portion 210. Further, in order to reduce action of stress on the electric connection portion when external force acts on the FPC 100, a reinforcing member 400 is suitably provided. In the example shown in FIG. 4A, the reinforcing member 400 is preferably joined to the other surface of the base film 101 with an adhesive (adhesive compound) 320 at a location on the back side of the electric connection portion of the FPC 100. With this configuration, stiffness is enhanced, and vibration resistance is improved accordingly. Note that if the reinforcing member 400 is fixed to the not-shown case, the vibration resistance is further improved. A plate-shaped member or a film-shaped member may be employed as the reinforcing member 400.

Next, the configuration of the electric connection portion shown in FIG. 4B will be described. The configuration of the FPC 100 is as described above. In the configuration shown in FIG. 4B, a portion of the cover film 103 in the vicinity of the other end of each line 102*a* of the first line group is absent, and a portion of the cover film 103 in the vicinity of the other end of each line 102*c* of the third line group is provided with an opening. Thus, the other end (more specifically, the vicinity of the tip end on the other side) of each line 102*a* of the first line group and the other end (more specifically, the vicinity of the tip end on the other side) of each line 102*c* of the third line group are exposed. In a state in which the expected bending region 140X is bent, the exposed portion of the line 102*a* and the exposed portion of the line 102*c* are electrically connected to each other via a solder portion 220. A method for providing the solder portion 220 is as described above. With this configuration, the electric connection portion can be easily visually recognized.

In the configuration shown in FIG. 4B, an insulating coating portion 510 coating the solder portion 220 is provided. In order to reduce short-circuit and degradation of the electric connection portion, the solder portion 220 is preferably coated, as described above, with the coating portion 510 which is made of an insulating material such as a resin material. The coating portion 510 also has an effect of reducing the bent portion 140 from returning to its original shape due to springback. Moreover, a configuration is preferably employed, in which the layers of the cover film 103 are bonded (adhere) to each other with the adhesive (adhesive compound) 310 in the vicinity of the solder portion 220 as described above. Further, the reinforcing member 400 is preferably joined to the other surface of the base film 101 with the adhesive (adhesive compound) 320 at the location on the back side of the electric connection portion of the FPC 100 as described above.

<Advantages of Battery Monitoring Module According to Present Embodiment>

According to the battery monitoring module of the present embodiment, line arrangement can be changed using the single-sided FPC having the multiple lines 102 only on one surface of the base film 101. As described above, in the present embodiment, the order of line arrangement of the FPC can be changed and the lines of the FPC can be rearranged in the order according to the level of the potential of the bus bar 11, without the need for using a double-sided FPC. Moreover, the connector 150 can be attached to the edge portion of the FPC 100. Thus, various general well-known connectors can be employed as the connector 150. With the above-described configuration, a cost can be reduced.

The order of line arrangement is according to the level of the potential, and therefore, a potential difference between adjacent ones of the lines of the FPC 100 and a potential difference between adjacent ones of the terminals of the connector 150 can be decreased. Thus, occurrence of short-circuit due to, e.g., migration can be reduced. Moreover, a potential difference between adjacent ones of terminals of the connector 51 provided in the ECU 50 is also decreased, and therefore, a circuit board in the ECU 50 can also be simplified.

Note that for the multiple lines 102 provided in the FPC 100, a configuration with lines which are used for purposes other than a purpose for electric connection (electric connection via the bus bars 11) to the electrodes of the battery may also be employed. That is, a configuration with lines other than the lines forming the first to third line groups may also be employed. In this case, the lines used for the purposes other than the purpose for connection to the electrodes of the battery may be provided among the multiple lines connected to the electrodes of the battery. A relationship between the potential of each line used for the purpose other than the purpose for connection to the electrode of the battery and the potential of each line connected to the electrode of the battery is not specifically limited. Generally, in the battery monitoring module, lines for temperature measurement are also provided in addition to the lines for voltage measurement, and the potential of the line for temperature measurement is lower than the potential of the line for voltage measurement. In a case where the lines for temperature measurement are provided among the lines for voltage measurement, a distance between the lines is preferably long enough to reduce occurrence of migration or the like. Thus, in, e.g., a case where the line for temperature measurement is provided between the line of which potential is V(2) and the line of which potential is V(3), a distance between the line for temperature measurement and the line of which potential is V(2) and a distance between the line for temperature measurement and the line of which potential is V(3) may be long.

Note that the present embodiment describes the configuration in which the other end of each line 102*b* of the second line group is arranged at the edge portion (one end portion of the FPC 100 in the longitudinal direction thereof) of the FPC 100 on one side in the array direction of the cell units 10 and the other end of each line 102*a* of the first line group is arranged in the expected bending region 140X of the FPC 100. Moreover, the present embodiment describes the configuration in which the expected bending region 140X is bent, and accordingly, the other end of each line 102*a* of the first line group and the other end of each line 102*c* of the third line group are electrically connected to each other.

However, a configuration may be employed, in which the other end of each line 102*a* of the first line group is arranged at the edge portion of the FPC 100 on one side in the array direction of the cell units 10 and the other end of each line 102*b* of the second line group is arranged in the expected bending region 140X of the FPC 100. In this case, a configuration in which the expected bending region 140X is bent and the other end of each line 102*b* of the second line group and the other end of each line 102*c* of the third line group are electrically connected to each other is employed, needless to say.

Second Embodiment

A battery monitoring module according to a second embodiment of the present disclosure will be described with reference to FIGS. 5, 6A, 6B, 7A, and 7B. The battery monitoring module according to the present embodiment is also suitably provided, for example, in a voltage monitoring device that monitors the voltage of a battery mounted on an electric vehicle. Note that in the present embodiment, the potential of a bus bar 11 is represented, in each figure, only by a number in parentheses without V( ).

A basic configuration of the battery monitoring module is as described in the first embodiment. In the present embodiment, the configuration of an FPC 100A is different from the configuration of the FPC 100 described in the first embodiment.

<FPC>

Figure 5:
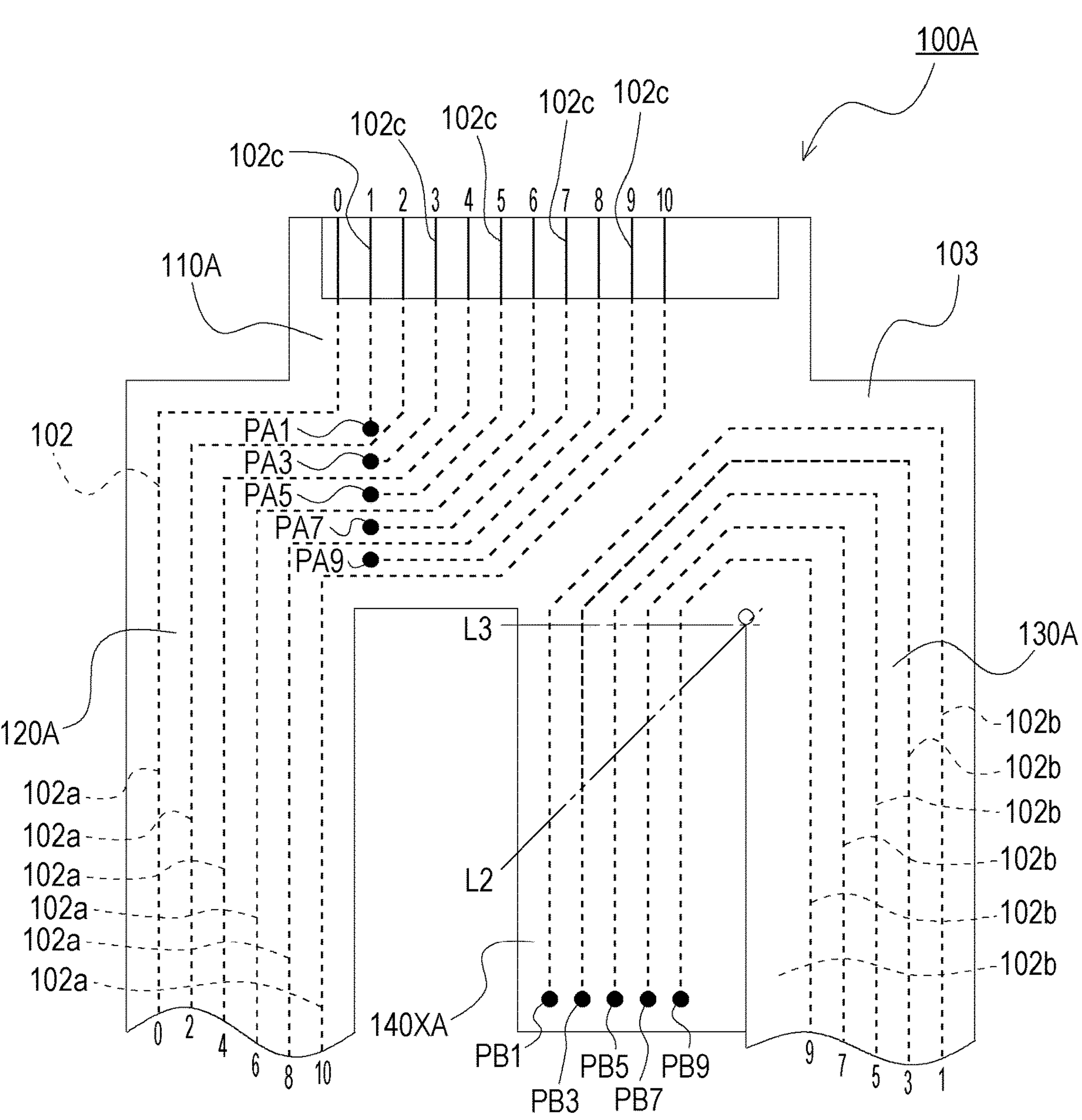
FIG. 5 is an enlarged view of a main portion of a flexible printed wiring board according to a second embodiment of the present disclosure.
Figures 6A, 6B:
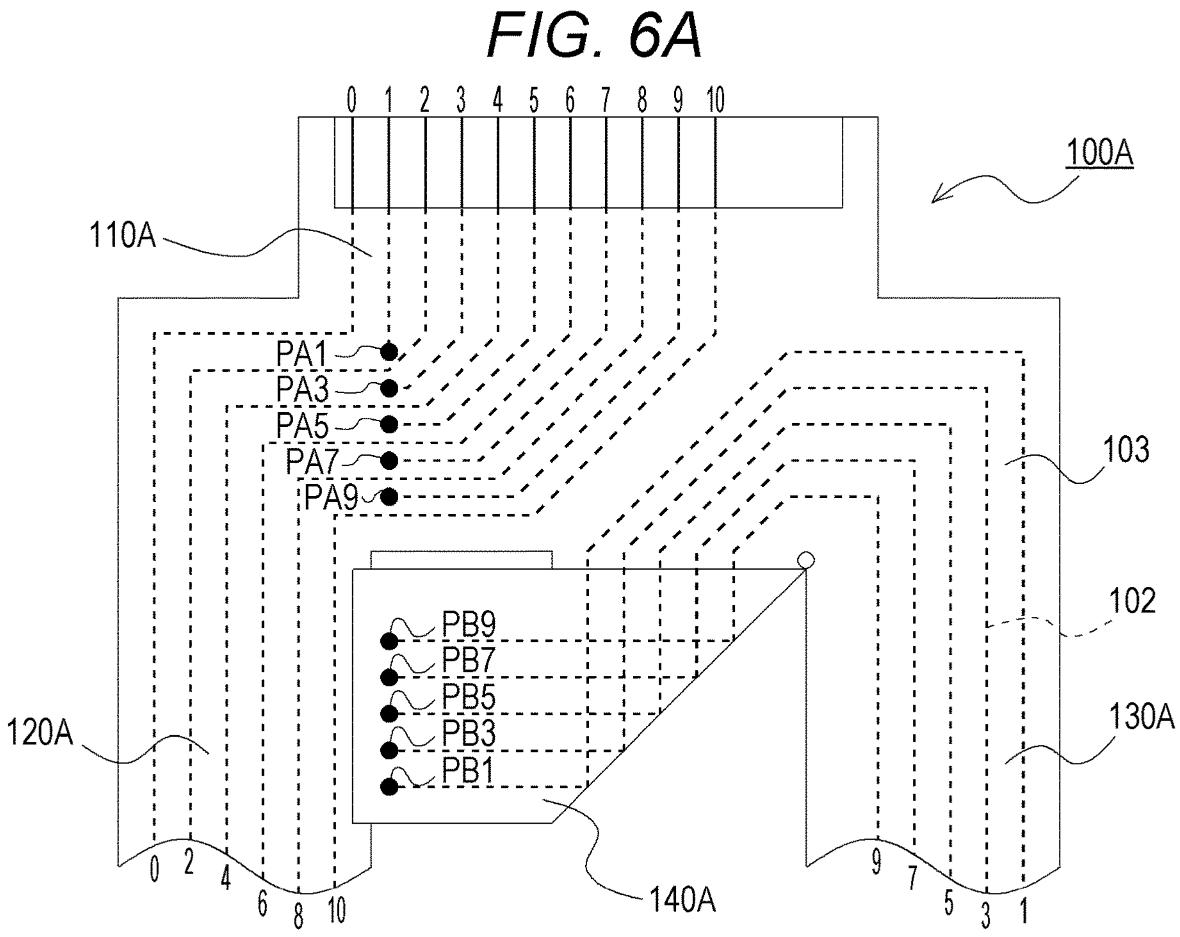
FIGS. 6A and 6B are enlarged views of the main portion of the flexible printed wiring board according to the second embodiment of the present disclosure.

The FPC 100A will be described specifically with reference to FIGS. 5, 6A, and 6B. The FPC 100A is a single-sided FPC having a conductor (e.g., copper foil) forming multiple lines only on one surface of a base film. FIGS. 5 and 6 are enlarged views (views showing part of a plan view in closeup) of a main portion of the FPC according to the second embodiment of the present disclosure. In the figure, lines provided inside are indicated by dashed lines.

The FPC 100A includes a trunk portion 110A, a first branch portion 120A and a second branch portion 130A branched from the trunk portion 110A, and a bent portion 140A. In each portion, multiple lines 102 formed by etching of metal foil (e.g., copper foil) are provided. The multiple lines 102 are exposed at an end portion of the trunk portion 110A. As in the first embodiment, a connector 150 (not shown) is provided at the end portion of the trunk portion 110A, and multiple terminals included in the connector 150 and the multiple exposed lines 102 are electrically connected to each other.

In the present embodiment, the first branch portion 120A is arranged at a portion of the battery in the vicinity of the bus bars 11 of which potentials are V(0), V(2), . . . , V(2n−2), and V(2n). Moreover, the second branch portion 130A is arranged at a portion of the battery in the vicinity of the bus bars 11 of which potentials are V(1), V(3), . . . , V(2n−3), and V(2n−1).

Note that many cell units are generally provided in the battery monitoring module, and therefore, the above-described number "n" of potentials is a great number. In the present embodiment, an example where n is 5 will be described for the sake of convenience in description. That is, the example shown in FIGS. 5, 6A, and 6B shows a case where the potentials of the bus bars 11 increase in the order of V(0) to V(10). Moreover, the first branch portion 120 is provided on the right side in the figure and the second branch portion 130 is provided on the left side in the figure in the first embodiment, and on the other hand, the first branch portion 120A is provided on the left side in the figure and the second branch portion 130A is provided on the right side in the figure in the present embodiment. In the case of the present embodiment, the multiple cell units 10 and the bus bars 11 are configured such that in FIGS. 5, 6A, and 6B, the potentials of the bus bars 11 on the left side are V(0), V(2), . . . , V(8), and V(10) and the potentials of the bus bars 11 on the right side are V(1), V(3), V(5), V(7), and V(9).

In the present embodiment, the multiple lines 102 include a first line group, a second line group, and a third line group. One end of each line of the first line group is connected to a corresponding one of the bus bars 11 of which potentials are V(0), V(2), . . . , V(8), and V(10). Each line forming the first line group is shown as a line 102*a* in the figure. One end of each line of the second line group is connected to a corresponding one of the bus bars 11 of which potentials are V(1), V(3), V(5), V(7), and V(9). Each line forming the second line group is shown as a line 102*b* in the figure. One end of each line of the third line group is arranged at an edge portion (a portion provided with the connector 150) of the FPC 100A on one side in an array direction of the cell units 10. Each line forming the third line group is shown as a line 102*c* in the figure. Electric connection between the line and the bus bar 11 is as described in the first embodiment.

The other end of each line 102*a* of the first line group is arranged at the edge portion (the portion provided with the connector 150) of the FPC 100A on one side in the array direction of the cell units 10. The other end of each line 102*b* of the second line group is arranged in an expected bending region 140XA of the FPC 100A. FIG. 5 is the view showing part of the plan view in closeup in a state before the FPC 100A is bent. Moreover, FIG. 6A is the view showing part of the plan view in closeup in a state after the FPC 100A has been bent for the first time. Further, FIG. 6B is the view showing part of the plan view in closeup in a state after the FPC 100A has been bent for the second time and end portions of the lines 102 have been electrically connected to each other.

In the present embodiment, the FPC 100A is bent twice at two bending lines L2, L3. That is, after the first bending at the bending line L2 in FIG. 5, the second bending at the bending line L3 is performed. In this manner, a bent portion 140A is formed. In FIG. 5, a region to be the bent portion 140A is equivalent to the above-described "expected bending region 140XA."

As shown in FIGS. 5 and 6A, the other end of each line 102*b* of the second line group is indicated by points PB1, PB3, PB5, PB7, PB9. Moreover, the other end of each line 102*c* of the third line group is indicated by points PA1, PA3, PA5, PA7, PA9.

In the FPC 100A according to the present embodiment, the expected bending region 140XA is bent, and accordingly, the other end of each line 102*b* of the second line group and the other end of each line 102*c* of the third line group are electrically connected to each other. As shown in FIG. 6B, electric connection portions where these lines are electrically connected to each other are indicated by points PAB1. PAB3, PAB5, PAB7, PAB9. With the above-described configuration, the potentials of the multiple lines arranged at the edge portion (the portion provided with the connector 150) of the FPC 100A on one side in the array direction of the cell units 10 can be arranged in the order of V(0), V(1). V(2) . . . . , V(8), V(9), and V(10).

<Electric Connection Portion>

The configuration of the electric connection portion where the other end of each line 102*b* of the second line group and the other end of each line 102*c* of the third line group are electrically connected to each other will be described. As a technique of forming the electric connection portion, various well-known techniques can be employed. Hereinafter, the configurations of two types of electric connection portion will be described with reference to FIGS. 7A and 7B. Note that schematic sectional views shown in FIGS. 7A and 7B are equivalent to sectional views along a BB line of FIG. 6B.

First, the configuration of the electric connection portion shown in FIG. 7A will be described. For the configuration of the FPC 100A, description of the same portions as those of the FPC 100 described in the first embodiment may be omitted.

Figure 7A:
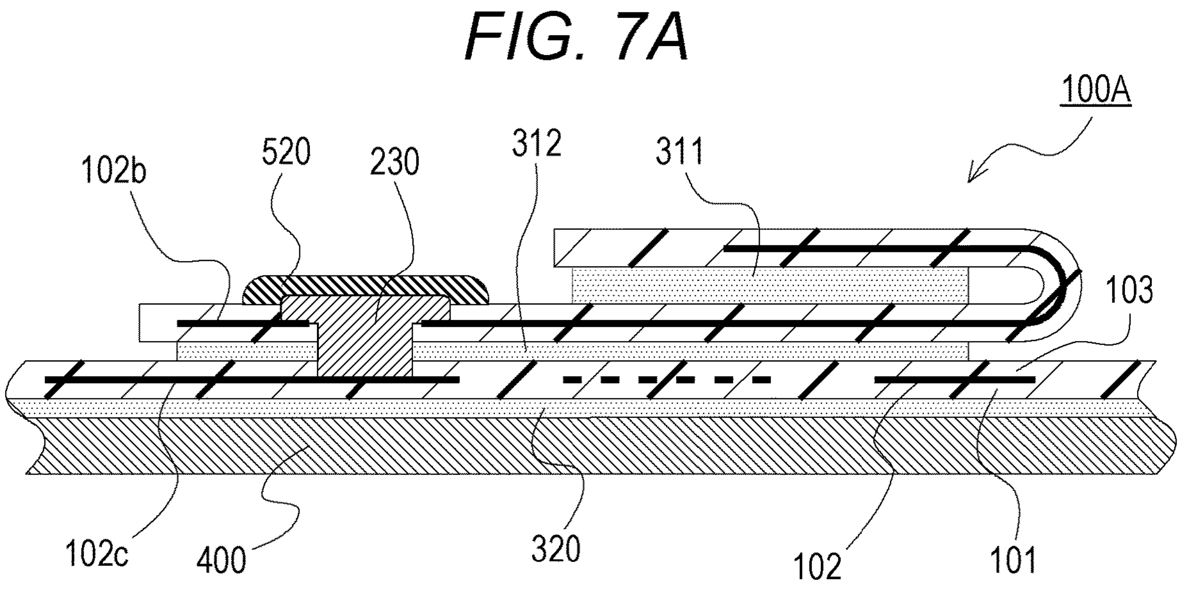
FIGS. 7A and 7B are schematic sectional views of the flexible printed wiring board according to the second embodiment of the present disclosure.
Figure 7B:
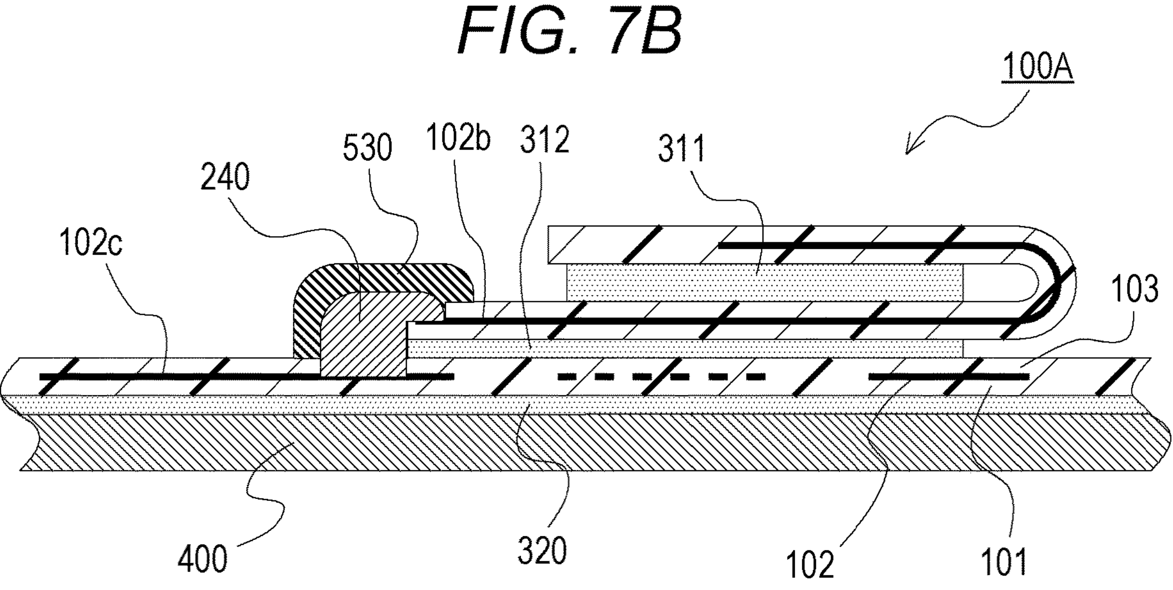

In the configuration shown in FIG. 7A, a cover film 103 in the vicinity of the other end of each line 102*c* of the third line group is provided with an opening. Moreover, the FPC 100A in the vicinity of the other end of each line 102*b* of the second line group is provided with a through-hole. Thus, the other end (more specifically, the vicinity of the tip end on the other side) of each line 102*b* of the second line group and the other end (more specifically, the vicinity of the tip end on the other side) of each line 102*c* of the third line group are exposed. As described above, in a state in which the expected bending region 140XA is bent, the exposed portion of the line 102*b* and the exposed portion of the line 102*c* are electrically connected to each other via a solder portion 230. A method for providing the solder portion 230 is as described in the first embodiment. In the case of the present embodiment, the upper surface side of the line 102*b* is exposed upon soldering, and therefore, there are advantages that soldering is more facilitated and the electric connection portion is more easily visually recognized as compared to the first embodiment.

In the configuration shown in FIG. 7A, an insulating coating portion 520 coating the solder portion 230 is provided. In order to reduce short-circuit and degradation of the electric connection portion, the solder portion 230 is preferably coated, as described above, with the coating portion 520 which is made of an insulating material such as a resin material. Moreover, in order to prevent the bent portion 140A from returning to its original shape due to springback and further enhance insulating properties, a configuration is preferably employed, in which in the vicinity of the solder portion 230, the layers of the cover film 103 are bonded (adhere) to each other with, e.g., an adhesive (adhesive compound) 311 and the cover film 103 and a base film 101 are bonded (adhere) to each other with, e.g., an adhesive (adhesive compound) 312. Further, in order to reduce action of stress on the electric connection portion when external force acts on the FPC 100A, a reinforcing member 400 is preferably joined to the other surface of the base film 101 with an adhesive (adhesive compound) 320 at a location on the back side of the electric connection portion of the FPC 100A. With this configuration, stiffness is enhanced, and vibration resistance is improved accordingly. Note that if the reinforcing member 400 is fixed to a not-shown case, the vibration resistance is further improved. A plate-shaped member or a film-shaped member may be employed as the reinforcing member 400.

Next, the configuration of the electric connection portion shown in FIG. 7B will be described. The configuration of the FPC 100A is as described above. In the configuration shown in FIG. 7B, a portion of the cover film 103 in the vicinity of the other end of each line 102*b* of the second line group is absent, and a portion of the cover film 103 in the vicinity of the other end of each line 102*c* of the third line group is provided with an opening. Thus, the other end (more specifically, the vicinity of the tip end on the other side) of each line 102*b* of the second line group and the other end (more specifically, the vicinity of the tip end on the other side) of each line 102*c* of the third line group are exposed. As described above, in a state in which the expected bending region 140XA is bent, the exposed portion of the line 102*b* and the exposed portion of the line 102*c* are electrically connected to each other via a solder portion 240. A method for providing the solder portion 240 is as described above. With this configuration, the electric connection portion can be easily visually recognized.

In the configuration shown in FIG. 7B, an insulating coating portion 530 coating the solder portion 240 is provided. In order to reduce short-circuit and degradation of the electric connection portion, the solder portion 240 is preferably coated, as described above, with the coating portion 530 which is made of an insulating material such as a resin material. The coating portion 530 also has an effect of reducing the bent portion 140A from returning to its original shape due to springback. Moreover, a configuration is preferably employed, in which in the vicinity of the solder portion 240, the layers of the cover film 103 are bonded (adhere) to each other with, e.g., the adhesive (adhesive compound) 311 and the cover film 103 and a base film 101 are bonded (adhere) to each other with, e.g., the adhesive (adhesive compound) 312. Further, the reinforcing member 400 is preferably joined to the other surface of the base film 101 with the adhesive (adhesive compound) 320 at a location on the back side of the electric connection portion of the FPC 100A.

In the battery monitoring module according to the present embodiment configured as described above, advantageous effects similar to those of the first embodiment can be obtained. The battery monitoring module according to the present embodiment is similar to that according to the first embodiment in that a configuration in which the multiple lines 102 provided in the FPC 100A include lines used for purposes other than the purpose for electric connection to the electrodes of the battery may be employed.

Note that the present embodiment describes the configuration in which the other end of each line 102*a* of the first line group is arranged at the edge portion of the FPC 100A on one side in the array direction of the cell units 10 and the other end of each line 102*b* of the second line group is arranged in the expected bending region 140XA of the FPC 100A. Moreover, the present embodiment describes the configuration in which the expected bending region 140XA is bent, and accordingly, the other end of each line 102*b* of the second line group and the other end of each line 102*c* of the third line group are electrically connected to each other.

However, a configuration may be employed, in which the other end of each line of the second line group is arranged at the edge portion of the FPC 100A on one side in the array direction of the cell units 10 and the other end of each line of the first line group is arranged in the expected bending region 140XA of the FPC 100A. In this case, the expected bending region 140XA is bent, and accordingly, the other end of each line of the first line group and the other end of each line of the third line group are electrically connected to each other.

Third Embodiment

A battery monitoring module according to a third embodiment of the present disclosure will be described with reference to FIGS. 8A and 8B. The battery monitoring module according to the present embodiment is also suitably provided, for example, in a voltage monitoring device that monitors the voltage of a battery mounted on an electric vehicle. Note that in the present embodiment, the potential of a bus bar 11 is represented, in FIGS. 8A and 8B, only by a number in parentheses without V( ).

A basic configuration of the battery monitoring module is as described in the first embodiment. In the present embodiment, the configuration of an FPC 100B is different from the configuration of the FPC 100 described in the first embodiment.

<FPC>

The FPC 100B will be described with reference to FIGS. 8A and 8B. The FPC 100B is a single-sided FPC having a conductor (e.g., copper foil) forming multiple lines only on one surface of a base film. FIGS. 8A and 8B are plan views of the FPC according to the third embodiment of the present disclosure. In the figure, lines provided inside are indicated by dashed lines.

The FPC 100B according to the present embodiment includes a trunk portion 110B, multiple bus bar connection tab portions 115B branched from the trunk portion 110B, and a bent portion 140B. In each portion, multiple lines 102 formed by etching of metal foil (e.g., copper foil) are provided. The multiple lines 102 are exposed at an end portion of the trunk portion 110B. As in the first embodiment, a connector 150 is provided at the end portion of the trunk portion 110B, and multiple terminals included in the connector 150 and the multiple exposed lines 102 are electrically connected to each other.

In the present embodiment, the trunk portion 110B is arranged at an upper portion of the battery including multiple cell units, and the multiple bus bar connection tab portions 115B are each arranged on upper portions of the bus bars 11 of which potentials are V(0), V(1), . . . , V(2n−1), and V(2n).

Note that many cell units are generally provided in the battery monitoring module, and therefore, the above-described number “n” is a great number. In the present embodiment, an example where n is 2 will be described for the sake of convenience in description. In the case of the present embodiment, the multiple cell units and the bus bars 11 are configured such that in FIGS. 8A and 8B, the potentials of the bus bars 11 on the left side are V(0), V(2), and V(4) and the potentials of the bus bars 11 on the right side are V(1) and V(3).

In the present embodiment, the multiple lines 102 include a first line group, a second line group, and a third line group. One end of each line of the first line group is connected to a corresponding one of the bus bars 11 of which potentials are V(0), V(2), and V(4). Each line forming the first line group is shown as a line 102*a* in the figure. One end of each line of the second line group is connected to a corresponding one of the bus bars 11 of which potentials are V(1) and V(3). Each line forming the second line group is shown as a line 102*b* in the figure. One end of each line of the third line group is arranged at an edge portion (a portion provided with the connector 150) of the FPC 100B on one side in an array direction of the cell units 10. Each line forming the third line group is shown as a line 102*c* in the figure. Electric connection between the line and the bus bar 11 is as described in the first embodiment.

The other end of each line 102*a* of the first line group is arranged at the edge portion (the portion provided with the connector 150) of the FPC 10B on one side in the array direction of the cell units 10. The other end of each line 102*b* of the second line group is arranged in an expected bending region 140XB of the FPC 100B. FIG. 8A shows a plan view in a state before the FPC 100B is bent. Moreover, FIG. 8B shows a plan view in a state after the FPC 100B has been bent and end portions of the lines 102 have been electrically connected to each other.

In the present embodiment, bending at a bending line L4 at a single location is performed. In this manner, the bent portion 140B is formed. Thus, in FIG. 8A, a region to be the bent portion 140B is equivalent to the “expected bending region 140XB.”

Figures 8A, 8B:
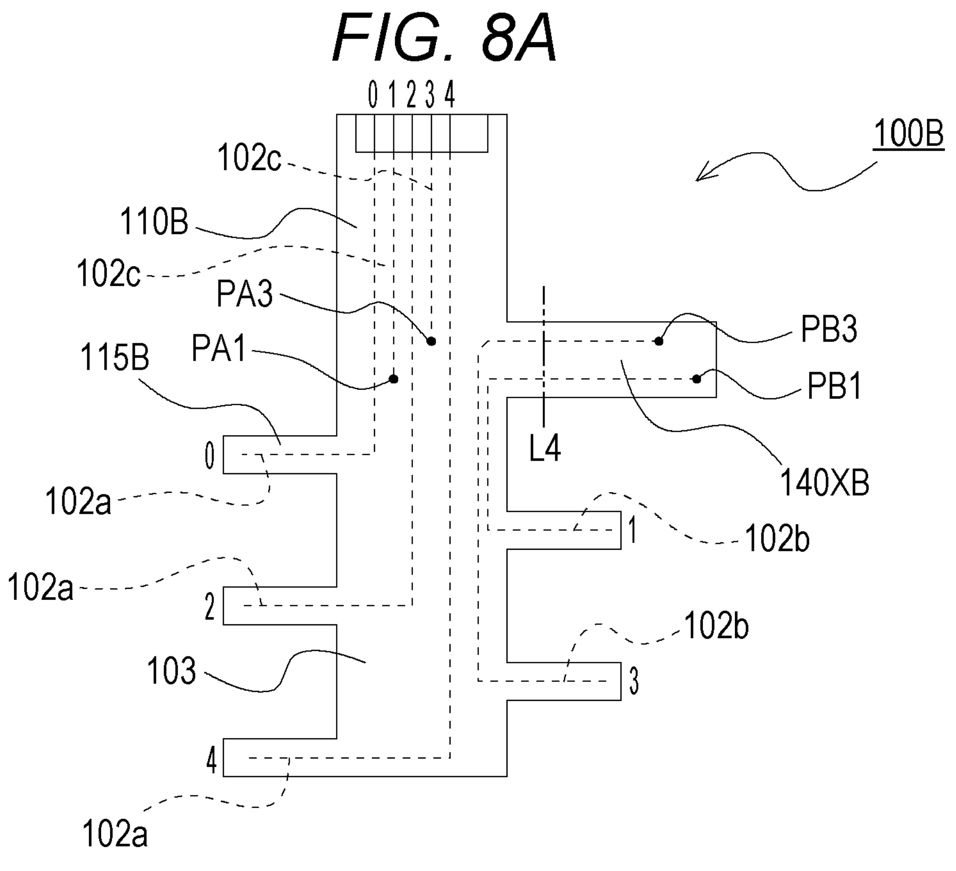
FIGS. 8A and 8B are plan views of a flexible printed wiring board according to a third embodiment of the present disclosure.

As shown in FIG. 8A, the other end of each line 102*b* of the second line group is indicated by points PB1, PB3. The other end of each line 102*c* of the third line group is indicated by points PA1, PA3.

In the FPC 100B according to the present embodiment, the expected bending region 140XB is bent, and accordingly, the other end of each line 102*b* of the second line group and the other end of each line 102*c* of the third line group are electrically connected to each other. As shown in FIG. 8B, electric connection portions where these lines are electrically connected to each other are indicated by points PAB1, PAB3. With the above-described configuration, the potentials of the multiple lines arranged at the edge portion (the portion provided with the connector 150) of the FPC 100B on one side in the array direction of the cell units 10 can be arranged in the order of V(0), V(1), V(2), V(3), and V(4).

The electric connection portion where the other end of each line 102*b* of the second line group and the other end of each line 102*c* of the third line group are electrically connected to each other is as described above in the first embodiment, and therefore, description thereof will be omitted.

In the battery monitoring module according to the present embodiment configured as described above, advantageous effects similar to those of the first embodiment can also be obtained. The battery monitoring module according to the present embodiment is similar to that according to the first embodiment in that a configuration in which the multiple lines 102 provided in the FPC 100B include lines used for purposes other than the purpose for electric connection to the electrodes of the battery may be employed.

Note that the present embodiment describes the configuration in which the other end of each line 102*a* of the first line group is arranged at the edge portion of the FPC 100B on one side in the array direction of the cell units 10 and the other end of each line 102*b* of the second line group is arranged in the expected bending region 140XB of the FPC 100B. Moreover, the present embodiment describes the configuration in which the expected bending region 140XB is bent, and accordingly, the other end of each line 102*b* of the second line group and the other end of each line 102*c* of the third line group are electrically connected to each other.

However, a configuration may be employed, in which the other end of each line of the second line group is arranged at the edge portion of the FPC 100B on one side in the array direction of the cell units 10 and the other end of each line of the first line group is arranged in the expected bending region 140XB of the FPC 100B. In this case, the expected bending region 140XB is bent, and accordingly, the other end of each line of the first line group and the other end of each line of the third line group are electrically connected to each other.

Fourth Embodiment

A battery monitoring module according to a fourth embodiment of the present disclosure will be described with reference to FIGS. 9A and 9B. The battery monitoring module according to the present embodiment is also suitably provided, for example, in a voltage monitoring device that monitors the voltage of a battery mounted on an electric vehicle. Note that in the present embodiment, the potential of a bus bar 11 is represented, in FIGS. 9A and 9B, only by a number in parentheses without V( ).

A basic configuration of the battery monitoring module is as described in the first embodiment. In the present embodiment, the configuration of an FPC 100C is different from the configuration of the FPC 100 described in the first embodiment.

<FPC>

The FPC 100C will be described with reference to FIGS. 9A and 9B. The FPC 100C is a single-sided FPC having a conductor (e.g., copper foil) forming multiple lines only on one surface of a base film. FIGS. 9A and 9B are plan views of the FPC according to the fourth embodiment of the present disclosure. In the figure, lines provided inside are indicated by dashed lines.

The FPC 100C according to the present embodiment includes a trunk portion 110C, multiple bus bar connection tab portions 115C branched from the trunk portion 110C, and multiple bent portions 140C. In each portion, multiple lines 102 formed by etching of metal foil (e.g., copper foil) are provided. The multiple lines 102 are exposed at an end portion of the trunk portion 110C. As in the first embodiment, a connector 150 is provided at the end portion of the trunk portion 110C, and multiple terminals included in the connector 150 and the multiple exposed lines 102 are electrically connected to each other.

In the present embodiment, the trunk portion 110C is arranged at an upper portion of the battery including multiple cell units, and the multiple bus bar connection tab portions 115C are each arranged on upper portions of the bus bars 11 of which potentials are V(0), V(1), . . . , V(2n−1), and V(2n).

Note that many cell units are generally provided in the battery monitoring module, and therefore, the above-described number "n" is a great number. In the present embodiment, an example where n is 2 will be described for the sake of convenience in description. In the case of the present embodiment, the multiple cell units and the bus bars 11 are configured such that in FIGS. 9A and 9B, the potentials of the bus bars 11 on the left side are V(0), V(2), and V(4) and the potentials of the bus bars 11 on the right side are V(1) and V(3).

In the present embodiment, the multiple lines 102 include a first line group, a second line group, and a third line group. One end of each line of the first line group is connected to a corresponding one of the bus bars 11 of which potentials are V(0), V(2), and V(4). Each line forming the first line group is shown as a line 102*a* in the figure. One end of each line of the second line group is connected to a corresponding one of the bus bars 11 of which potentials are V(1) and V(3). Each line forming the second line group is shown as a line 102*b* in the figure. One end of each line of the third line group is arranged at an edge portion (a portion provided with the connector 150) of the FPC 100C on one side in an array direction of the cell units 10. Each line forming the third line group is shown as a line 102*c* in the figure. Electric connection between the line and the bus bar 11 is as described in the first embodiment.

The other end of each line 102*a* of the first line group is arranged at the edge portion (the portion provided with the connector 150) of the FPC 100C on one side in the array direction of the cell units 10. The other end of each line 102*b* of the second line group is arranged in an expected bending region 140XC of the FPC 100C. FIG. 9A shows a plan view in a state before the FPC 100C is bent. Moreover, FIG. 9B shows a plan view in a state after the FPC 100C has been bent and end portions of the lines 102 have been electrically connected to each other.

In the present embodiment, bending at multiple bending lines L5 is performed. In this manner, the multiple bent portions 140C are formed. Thus, in FIG. 9A, a region to be the bent portion 140C is equivalent to the "expected bending region 140XC." In the case of the present embodiment, the expected bending regions 140XC are separately provided for the lines 102*b* of the second line group.

Figure 9A:
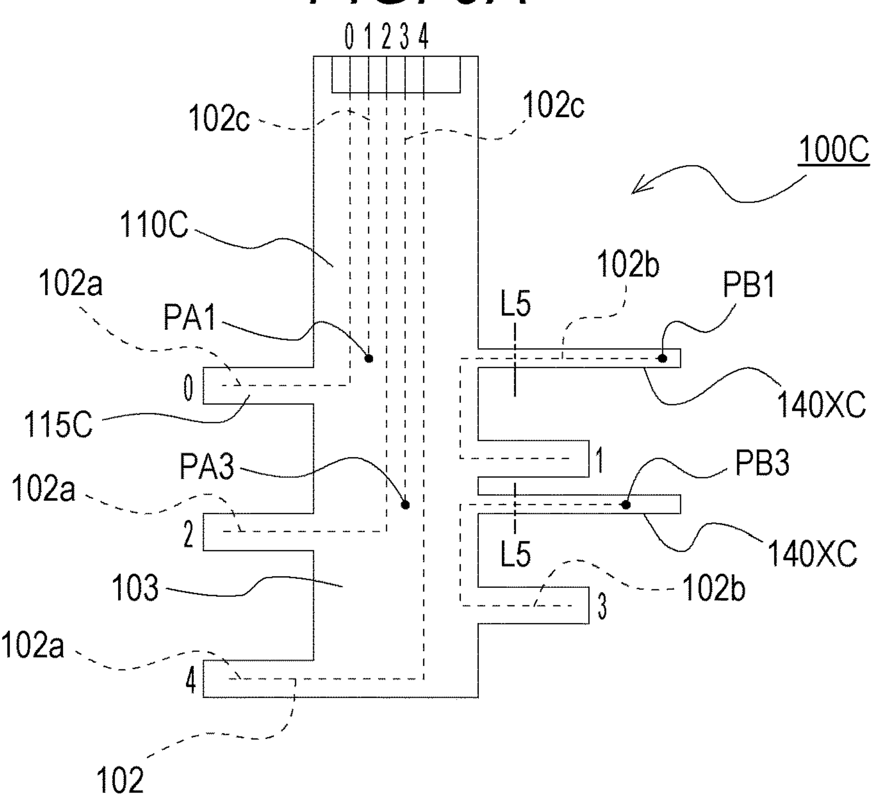
FIGS. 9A and 9B are plan views of a flexible printed wiring board according to a fourth embodiment of the present disclosure.
Figure 9B:
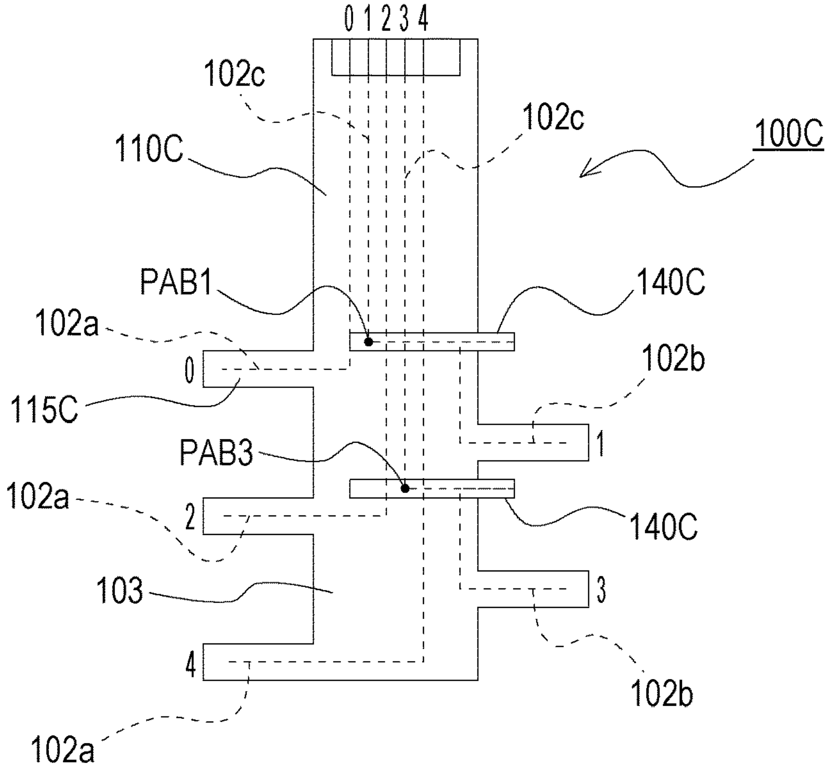

As shown in FIG. 9A, the other end of each line 102*b* of the second line group is indicated by points PB1, PB3. The other end of each line 102*c* of the third line group is indicated by points PA1, PA3.

In the FPC 100C according to the present embodiment, the expected bending region 140XC provided for each line 102*b* is bent, and accordingly, the other end of each line 102*b* of the second line group and the other end of each line 102*c* of the third line group are electrically connected to each other. As shown in FIG. 9B, electric connection portions where these lines are electrically connected to each other are indicated by points PAB1, PAB3. With the above-described configuration, the potentials of the multiple lines arranged at the edge portion (the portion provided with the connector 150) of the FPC 100C on one side in the array direction of the cell units 10 can be arranged in the order of V(0), V(1), V(2), V(3), and V(4).

The electric connection portion where the other end of each line 102*b* of the second line group and the other end of each line 102*c* of the third line group are electrically connected to each other is as described above in the first embodiment, and therefore, description thereof will be omitted.

In the battery monitoring module according to the present embodiment configured as described above, advantageous effects similar to those of the first embodiment can also be obtained. The battery monitoring module according to the present embodiment is similar to that according to the first embodiment in that a configuration in which the multiple lines 102 provided in the FPC 100C include lines used for purposes other than the purpose for electric connection to the electrodes of the battery may be employed.

Note that the present embodiment describes the configuration in which the other end of each line 102*a* of the first line group is arranged at the edge portion of the FPC 100C on one side in the array direction of the cell units 10 and the other end of each line 102*b* of the second line group is arranged in the expected bending region 140XC of the FPC 100C. Moreover, the present embodiment describes the configuration in which all the expected bending regions 140XC are bent, and accordingly, the other end of each line 102*b* of the second line group and the other end of each line 102*c* of the third line group are electrically connected to each other.

However, a configuration may be employed, in which the other end of each line of the second line group is arranged at the edge portion of the FPC 100C on one side in the array direction of the cell units 10 and the other end of each line of the first line group is arranged in the expected bending region 140XC of the FPC 100C. In this case, all the multiple expected bending regions 140XC are bent, and accordingly, the other end of each line of the first line group and the other end of each line of the third line group are electrically connected to each other.

Fifth Embodiment

A battery monitoring module according to a fifth embodiment of the present disclosure will be described with reference to FIGS. 10A and 10B. The battery monitoring module according to the present embodiment is also suitably provided, for example, in a voltage monitoring device that monitors the voltage of a battery mounted on an electric vehicle. Note that in the present embodiment, the potential of a bus bar 11 is represented, in FIGS. 10A and 10B, only by a number in parentheses without V( ).

A basic configuration of the battery monitoring module is as described in the first embodiment. In the present embodiment, the configuration of an FPC 100D is different from the configuration of the FPC 100 described in the first embodiment.

<FPC>

The FPC 100D will be described with reference to FIGS. 10A and 10B. The FPC 100D is a single-sided FPC having a conductor (e.g., copper foil) forming multiple lines only on one surface of a base film. FIGS. 10A and 10B are plan views of the FPC according to the fifth embodiment of the present disclosure. In the figure, lines provided inside are indicated by dashed lines.

The FPC 100D according to the present embodiment includes a trunk portion 110D, a first branch portion 120D and a second branch portion 130D branched from the trunk portion 110D, and a bent portion 140D. In each portion, multiple lines 102 formed by etching of metal foil (e.g., copper foil) are provided. The multiple lines 102 are exposed at an end portion of the trunk portion 110D. A connector 150 is provided at the end portion of the trunk portion 110D, and multiple terminals included in the connector 150 and the multiple exposed lines 102 are electrically connected to each other.

In the present embodiment, the first branch portion 120D is arranged at a portion of the battery in the vicinity of the bus bars 11 of which potentials are V(0), V(2), . . . , V(2n−2), and V(2n). Moreover, the second branch portion 130D is arranged at a portion of the battery in the vicinity of the bus bars 11 of which potentials are V(1), V(3), . . . , V(2n−3), and V(2n−1).

Figure 10A:
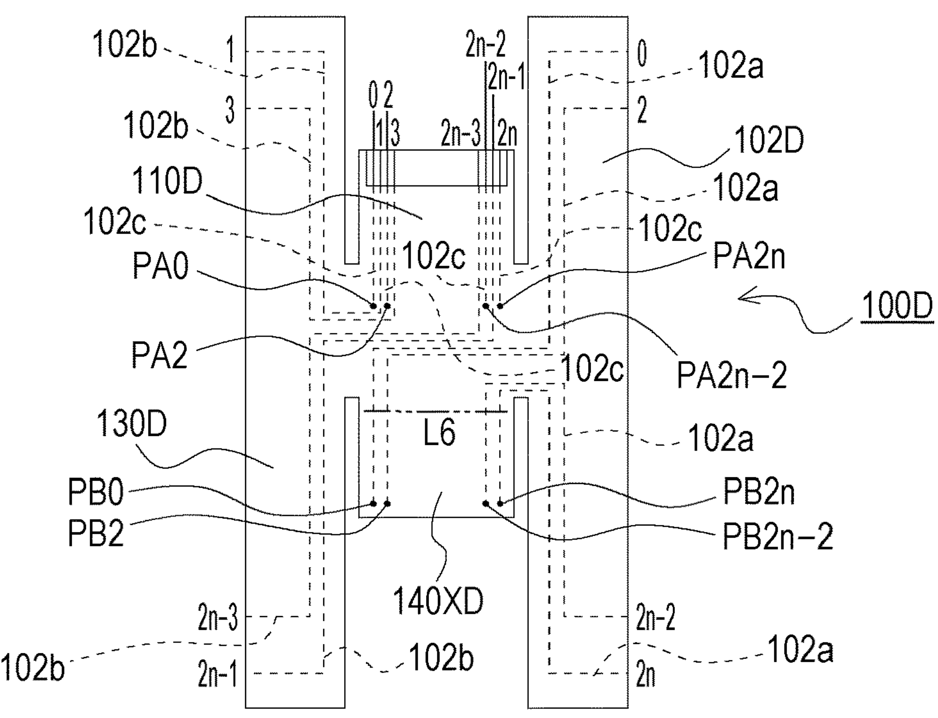
FIGS. 10A and 10B are plan views of a flexible printed wiring board according to a fifth embodiment of the present disclosure.
Figure 10B:
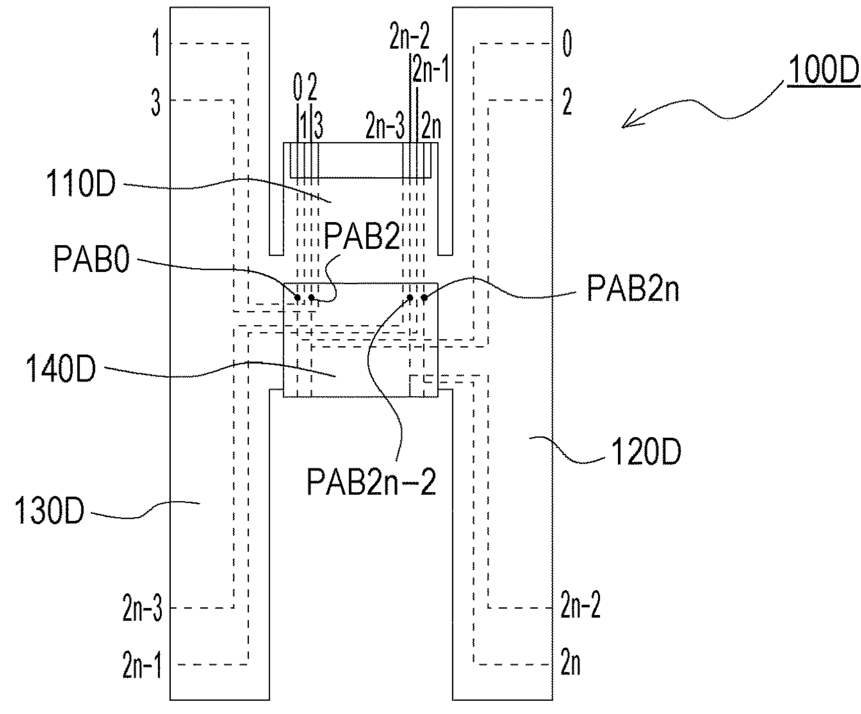
Figure 11:
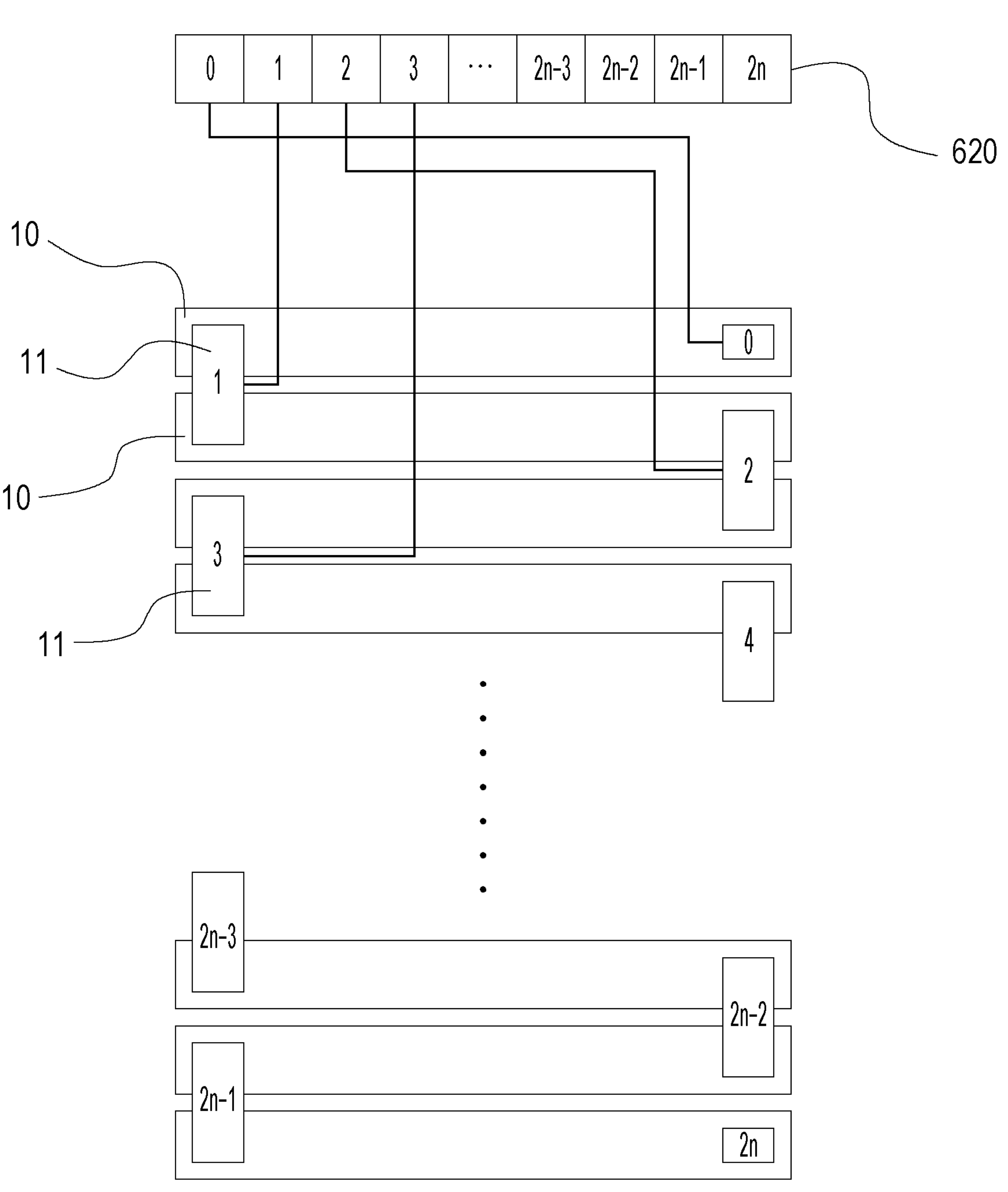
FIG. 11 is a view for describing electric wiring of a battery monitoring module attached to a battery.
Figure 12:
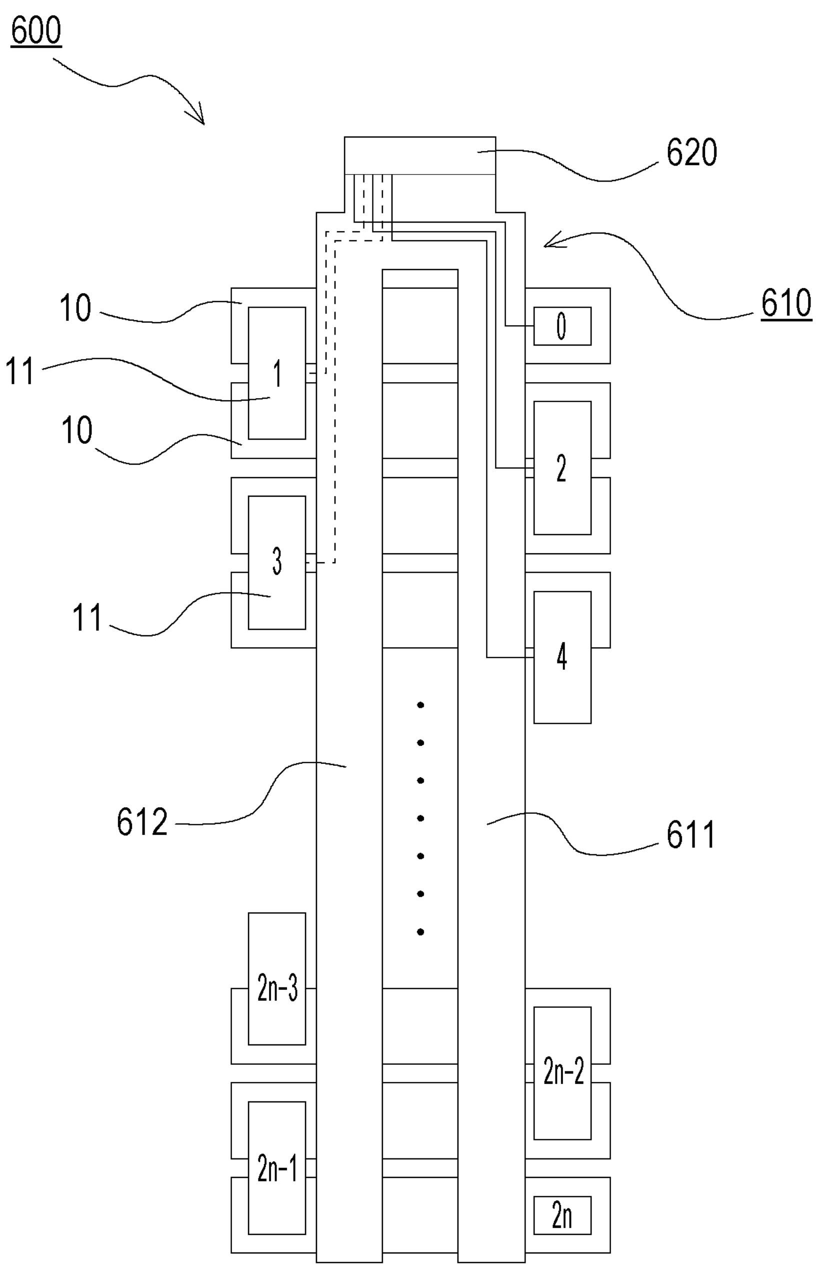
FIG. 12 is a plan view showing a state in which a battery monitoring module according to the prior art is attached to a battery.

In FIGS. 10A and 10B, only the lines 102 connected to the bus bars 11 of which potentials are V(0) to V(3) and V(2n−3) to V(2n) are shown, and the lines 102 connected to the bus bars 11 of which potentials are V(4) to V(2n−4) are not shown.

In the present embodiment, the multiple lines 102 include a first line group, a second line group, and a third line group. One end of each line of the first line group is connected to a corresponding one of the bus bars 11 of which potentials are V(0), V(2), . . . , V(2n−2), and V(2n). Each line forming the first line group is shown as a line 102*a* in the figure. One end of each line of the second line group is connected to a corresponding one of the bus bars 11 of which potentials are V(1), V(3), . . . , V(2n−3), and V(2n−1). Each line forming the second line group is shown as a line 102*b* in the figure. One end of each line of the third line group is arranged at an edge portion (a portion provided with the connector 150) of the FPC 100D on one side in an array direction of cell units 10. Each line forming the third line group is shown as a line 102*c* in the figure. Electric connection between the line and the bus bar 11 is as described in the first embodiment.

The other end of each line 102*b* of the second line group is arranged at the edge portion of the FPC 100D on one side in the array direction of the cell units 10. The other end of each line 102*a* of the first line group is arranged in an expected bending region 140XD of the FPC 100D. FIG. 10A is the view showing part of the plan view in closeup in a state before the FPC 100D is bent. Moreover, FIG. 10B is the view showing part of the plan view in closeup in a state after the FPC 100D has been bent and end portions of the lines 102 have been electrically connected to each other. The FPC 100D is bent at a bending line L6 indicated by a chain double-dashed line in FIG. 10A, and in this manner, the bent portion 140D is formed. Thus, in FIG. 10A, a region to be the bent portion 140D is equivalent to the above-described "expected bending region 140XD."

As shown in FIG. 10A, the other end of each line 102*a* of the first line group is indicated by points PB0, PB2, . . . , PB2*n*−2, PB2*n*. Moreover, the other end of each line 102*c* of the third line group is indicated by points PA0, PA2, . . . , PA2*n*−2, PA2*n*.

In the FPC 100D according to the present embodiment, the expected bending region 140XD is bent, and accordingly, the other end of each line 102*a* of the first line group and the other end of each line 102*c* of the third line group are electrically connected to each other. As shown in FIG. 10B, electric connection portions where these lines are electrically connected to each other are indicated by points PAB0, PAB2, . . . , PAB2*n*−2, PAB2*n*. With the above-described configuration, the potentials of the multiple lines arranged at the edge portion (the portion provided with the connector 150) of the FPC 100D on one side in the array direction of the cell units 10 can be arranged in the order of V(0), V(1), V(2), V(3) . . . , V(2n−3), V(2n−2), V(2n−1), and V(2n).

The electric connection portion where the other end of each line 102*a* of the first line group and the other end of each line 102*c* of the third line group are electrically connected to each other is as described above in the first embodiment, and therefore, description thereof will be omitted.

In the battery monitoring module according to the present embodiment configured as described above, advantageous effects similar to those of the first embodiment can also be obtained. The battery monitoring module according to the present embodiment is similar to that according to the first embodiment in that a configuration in which the multiple lines 102 provided in the FPC 100D include lines used for purposes other than the purpose for electric connection to the electrodes of the battery may be employed.

Note that the present embodiment describes the configuration in which the other end of each line 102*b* of the second line group is arranged at the edge portion of the FPC 100D on one side in the array direction of the cell units 10 and the other end of each line 102*a* of the first line group is arranged in the expected bending region 140XD of the FPC 100D. Moreover, the present embodiment describes the configuration in which the expected bending region 140XD is bent, and accordingly, the other end of each line 102*a* of the first line group and the other end of each line 102*c* of the third line group are electrically connected to each other.

However, a configuration may be employed, in which the other end of each line of the first line group is arranged at the edge portion of the FPC 100D on one side in the array direction of the cell units 10 and the other end of each line of the second line group is arranged in the expected bending region 140XD of the FPC 100D. In this case, the expected bending region 140XD is bent, and accordingly, the other end of each line of the second line group and the other end of each line of the third line group are electrically connected to each other.

The first to fourth embodiments above describes the configuration in which the connector 150 is attached to the endmost edge portion (the endmost end portion of the FPC on one side in the longitudinal direction thereof) of the FPC on one side in the array direction of the cell units 10. On the other hand, in the present embodiment, the connector 150 is fixed, in the vicinity of the center of the FPC in the longitudinal direction thereof, to the edge portion of the FPC on one side in the array direction of the cell units 10. The location to which the connector 150 is attached may only be required to be the edge portion of the FPC on one side in the array direction of the cell units 10, and the location of the FPC in the longitudinal direction thereof is not limited.

As described above, the battery monitoring module of the present disclosure is attached to the battery configured such that the multiple cell units, each of which includes the single cell or the multiple cells connected in parallel, are arrayed such that the positive and negative electrodes of adjacent ones of the cell units face each other and are connected in series by connection of the positive and negative electrodes of adjacent ones of the cell units via the terminal. The battery monitoring module includes the flexible printed wiring board having the multiple lines only on one surface of the base film, and the connector attached to the edge portion of the flexible printed wiring board on one side in the array direction of the cell units. The battery is configured such that the potential of the terminal connected at least to either one of the positive or negative electrode increases in the array direction in the alternate manner on both sides with respect to the direction perpendicular to the array direction. If the potential of the terminal is, in the ascending order, V(0), V(1), V(2), V(3), . . . , V(2n−3), V(2n−2), V(2n−1), and V(2n), the multiple lines include the first line group connected, at one end of each line, to the terminals of which potentials are V(0), V(2), . . . , V(2n−2), and V(2n), the second line group connected, at one end of each line, to the terminals of which potentials are V(1), V(3), . . . , V(2n−3), and V(2n−1), and the third line group arranged, at one end of each line, at the edge portion of the flexible printed wiring board. The other end of each line of one of the first or second line group is arranged at the edge portion of the flexible printed wiring board, and the other end of each line of the other one of the first or second line group is arranged in the expected bending region of the flexible printed wiring board. The expected bending region is bent such that the other end of each line of the other one of the first or second line group and the other end of each line of the third line group are electrically connected to each other, and accordingly, the potentials of the multiple lines arranged at the edge portion of the flexible printed wiring board are arranged in the order of V(0), V(1), V(2), V(3), . . . , V(2n−3), V(2n−2), V(2n−1), and V(2n).

The flexible printed wiring board of the present disclosure is included in the battery monitoring module attached to the battery configured such that the multiple cell units, each of which includes the single cell or the multiple cells connected in parallel, are arrayed such that the positive and negative electrodes of adjacent ones of the cell units face each other and are connected in series by connection of the positive and negative electrodes of adjacent ones of the cell units via the terminal. The flexible printed wiring board has the base film and the multiple lines provided only on one surface of the base film. The connector is attached to the edge portion of the flexible printed wiring board on one side in the array direction of the cell units. The battery is configured such that the potential of the terminal connected at least to either one of the positive or negative electrode increases in the array direction in the alternate manner on both sides with respect to the direction perpendicular to the array direction. If the potential of the terminal is, in the ascending order, V(0), V(1), V(2), V(3), . . . , V(2n−3), V(2n−2). V(2n−1), and V(2n), the multiple lines include the first line group connected, at one end of each line, to the terminals of which potentials are V(o), V(2), . . . , V(2n−2), and V(2n), the second line group connected, at one end of each line, to the terminals of which potentials are V(1), V(3), . . . , V(2n−3), and V(2n−1), and the third line group arranged, at one end of each line, at the edge portion. The other end of each line of one of the first or second line group is arranged at the edge portion, and the other end of each line of the other one of the first or second line group is arranged in the expected bending region. The expected bending region is bent such that the other end of each line of the other one of the first or second line group and the other end of each line of the third line group are electrically connected to each other, and accordingly, the potentials of the multiple lines arranged at the edge portion are arranged in the order of V(0), V(1), V(2), V(3), . . . , V(2n−3), V(2n−2), V(2n−1), and V(2n).

The expected bending region may be provided only at one location, or the expected bending regions may be provided at multiple locations each corresponding to the lines of the other one of the first or second line group.

The expected bending region may be bent once at one bending line, or the expected bending regions may be bent twice at two bending lines.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A flexible printed wiring board attached to a battery, comprising:

a trunk portion;

a first branch portion;

a second branch portion;

a bent portion; and multiple lines, wherein the first branch portion and the second branch portion are branched from the trunk portion, the multiple lines are provided only on one surface of the flexible printed wiring board, and include a first line group, a second line group, and a third line group, the first line group is arranged over the trunk portion, the first branch portion, and the bent portion, the second line group is arranged over the trunk portion and the second branch portion, the third line group is arranged at the trunk portion, one end of each line of the first line group is connected to a corresponding one of multiple terminals of the battery, and the other end of each line of the first line group is arranged in the bent portion, one end of each line of the second line group is connected to a corresponding one of the multiple terminals of the battery, and the other end of each line of the second line group is arranged at an end portion of the trunk portion in a longitudinal direction of the flexible printed wiring board, one end of each line of the third line group is arranged at the end portion of the trunk portion, and the other end of each line of the third line group is arranged in the trunk portion, and the bent portion is bent to fold over the trunk portion such that the other end of each line of the first line group arranged in the bent portion and the other end of each line of the third line group arranged in the trunk portion are connected to each other.

2. The flexible printed wiring board according to claim 1, wherein in a case where potentials of the multiple terminals increase in an order of V(0), V(1), V(2), V(3), . . . , V(2n−3), V(2n−2), V(2n−1), and V(2n) (n is an integer), the one end of each line of the first line group is connected to a corresponding one of the multiple terminals of which potentials are V(0), V(2), . . . , V(2n−2), and V(2n), the one end of each line of the second line group is connected to a corresponding one of the multiple terminals of which potentials are V(1), V(3), . . . , V(2n−3), and V(2n−1), and potentials of the multiple lines arranged at the end portion of the trunk portion are arranged in an order of V(0), V(1), V(2), V(3), . . . , V(2n−3), V(2n−2), V(2n−1), and V(2n).

3. The flexible printed wiring board according to claim 1, wherein the bent portion includes only one bent portion.

4. The flexible printed wiring board according to claim 1, wherein the first branch portion includes multiple first branch portions, and the bent portion includes multiple bent portions each corresponding to the multiple first branch portions.

5. The flexible printed wiring board according to claim 1, wherein the bent portion is bent once at one bending line.

6. The flexible printed wiring board according to claim 1, wherein the bent portion is bent twice at two bending lines.

7. A battery monitoring module comprising:

the flexible printed wiring board according to claim 1; and a connector, wherein the connector is attached to the end portion of the trunk portion of the flexible printed wiring board.

8. The flexible printed wiring board according to claim 1, wherein the bent portion is positioned between the first branch portion and the second branch portion, and extends on an opposite side of the end of the trunk portion.

9. A flexible printed wiring board attached to a battery, comprising:

a trunk portion;

a first branch portion;

a second branch portion;

a bent portion; and multiple lines, wherein the multiple lines are provided only on one surface of the flexible printed wiring board, and include a first line group, a second line group, and a third line group, the first line group is arranged over the trunk portion, the first branch portion, and the bent portion, the second line group is arranged over the trunk portion and the second branch portion, the third line group is arranged at the trunk portion, one end of each line of the first line group is connected to a corresponding one of multiple terminals of the battery, and the other end of each line of the first line group is arranged in the bent portion, one end of each line of the second line group is connected to a corresponding one of the multiple terminals of the battery, and the other end of each line of the second line group is arranged at an end portion of the trunk portion in a longitudinal direction of the flexible printed wiring board, one end of each line of the third line group is arranged at the end portion of the trunk portion, and the other end of each line of the third line group is arranged in the trunk portion, the bent portion is bent to fold over the trunk portion such that the other end of each line of the first line group arranged in the bent portion and the other end of each line of the third line group arranged in the trunk portion are connected to each other, and the bent portion is positioned between the first branch portion and the second branch portion, and extends on an opposite side of the end of the trunk portion.

10. The flexible printed wiring board according to claim 9, wherein in a case where potentials of the multiple terminals increase in an order of V(0), V(1), V(2), V(3), . . . , V(2n−3), V(2n−2), V(2n−1), and V(2n) (n is an integer), the one end of each line of the first line group is connected to a corresponding one of the multiple terminals of which potentials are V(0), V(2), . . . , V(2n−2), and V(2n), the one end of each line of the second line group is connected to a corresponding one of the multiple terminals of which potentials are V(1), V(3), . . . , V(2n−3), and V(2n−1), and potentials of the multiple lines arranged at the end portion of the trunk portion are arranged in an order of V(0), V(1), V(2), V(3), . . . , V(2n−3), V(2n−2), V(2n−1), and V(2n).

11. The flexible printed wiring board according to claim 9, wherein the bent portion includes only one bent portion.

12. The flexible printed wiring board according to claim 9, wherein the first branch portion includes multiple first branch portions, and the bent portion includes multiple bent portions each corresponding to the multiple first branch portions.

13. The flexible printed wiring board according to claim 9, wherein the bent portion is bent once at one bending line.

14. The flexible printed wiring board according to claim 9, wherein the bent portion is bent twice at two bending lines.

15. A battery monitoring module comprising:

the flexible printed wiring board according to claim 9; and a connector, wherein the connector is attached to the end portion of the trunk portion of the flexible printed wiring board.

* * * * *